(12) United States Patent
Fukushima et al.

(10) Patent No.: US 12,302,565 B2
(45) Date of Patent: May 13, 2025

(54) SEMICONDUCTOR STORAGE DEVICE

(71) Applicant: Kioxia Corporation, Tokyo (JP)

(72) Inventors: Takashi Fukushima, Mie (JP); Yuji Sakai, Mie (JP); Hiroshi Itokawa, Mie (JP); Tatsunori Isogai, Mie (JP); Ryosuke Sawabe, Mie (JP)

(73) Assignee: KIOXIA CORPORATION, Tokyo (JP)

( * ) Notice: Subject to any disclaimer, the term of this patent is extended or adjusted under 35 U.S.C. 154(b) by 474 days.

(21) Appl. No.: 17/683,963

(22) Filed: Mar. 1, 2022

(65) Prior Publication Data
US 2023/0073505 A1     Mar. 9, 2023

(30) Foreign Application Priority Data

Sep. 8, 2021    (JP) ................................. 2021-146058

(51) Int. Cl.
| | | |
|---|---|---|
| *H10B 43/27* | (2023.01) | |
| *H10B 41/10* | (2023.01) | |
| *H10B 41/27* | (2023.01) | |
| *H10B 43/10* | (2023.01) | |

(52) U.S. Cl.
CPC ............. *H10B 43/27* (2023.02); *H10B 41/10* (2023.02); *H10B 41/27* (2023.02); *H10B 43/10* (2023.02)

(58) Field of Classification Search
CPC ................................ H10B 41/10; H10B 41/27
See application file for complete search history.

(56) References Cited

U.S. PATENT DOCUMENTS

| | | | |
|---|---|---|---|
| 7,852,675 B2 | 12/2010 | Maejima | |
| 7,852,676 B2 | 12/2010 | Maejima | |
| 9,343,469 B2 | 5/2016 | Sun et al. | |
| 2017/0263621 A1* | 9/2017 | Wakatsuki | ............. H10B 43/27 |
| 2020/0251381 A1 | 8/2020 | Zhou | |
| 2020/0328280 A1* | 10/2020 | Gandhi | ............. H01L 29/40117 |
| 2021/0057438 A1 | 2/2021 | Hopkins et al. | |
| 2021/0233779 A1 | 7/2021 | Kang et al. | |

FOREIGN PATENT DOCUMENTS

| | | |
|---|---|---|
| JP | 2018-026518 A | 2/2018 |
| TW | 202030871 A | 8/2020 |

* cited by examiner

*Primary Examiner* — Jay C Chang
*Assistant Examiner* — Mikka Liu
(74) *Attorney, Agent, or Firm* — Foley & Lardner LLP

(57) ABSTRACT

A semiconductor storage device includes: a plurality of conductive layers arranged in a first direction; a semiconductor layer extending in the first direction and facing the plurality of conductive layers; a charge storage layer provided between the plurality of conductive layers and the semiconductor layer; a first structure disposed apart from the semiconductor layer in a second direction intersecting the first direction, extending in a third direction intersecting the first direction and the second direction, and facing the plurality of conductive layers; and a plurality of first nitride films containing nitrogen (N), and covering surfaces of the plurality of conductive layers facing the first structure.

17 Claims, 33 Drawing Sheets

SEMICONDUCTOR STORAGE DEVICE

CROSS-REFERENCE TO RELATED APPLICATION

This application is based upon and claims the benefit of priority from Japanese Patent Application No. 2021-146058, filed Sep. 8, 2021, the entire contents of which are incorporated herein by reference.

FIELD

Embodiments described herein relate generally to a semiconductor storage device.

BACKGROUND

Known is a semiconductor storage device including a plurality of conductive layers arranged in a first direction, a semiconductor layer extending in the first direction and facing the plurality of conductive layers, and a charge storage layer provided between the plurality of conductive layers and the semiconductor layer.

DETAILED DESCRIPTION

Figure 1:
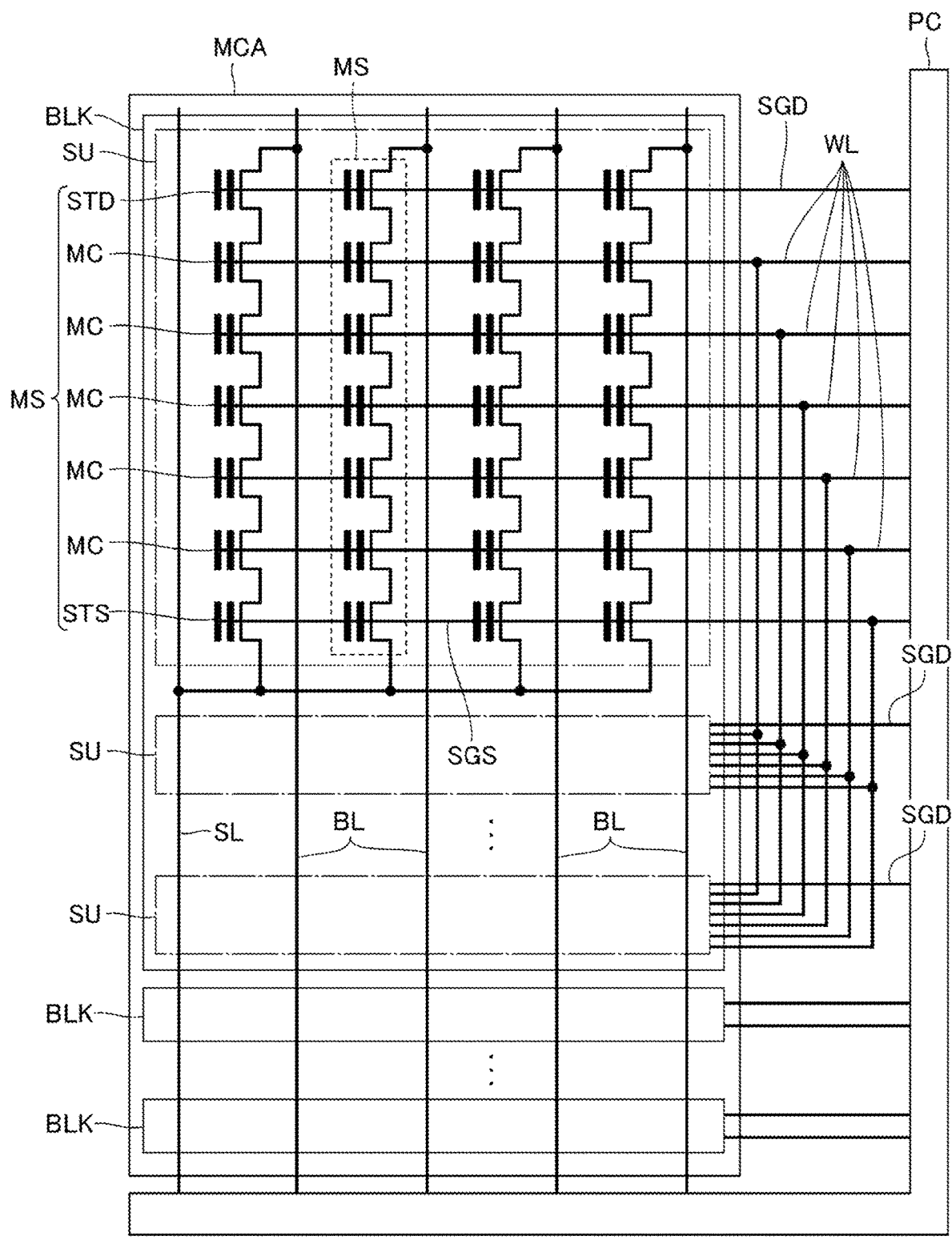
FIG. 1 is a schematic circuit diagram illustrating a partial configuration of a semiconductor storage device according to a first embodiment.

Embodiments provide a semiconductor storage device having a good characteristic.

In general, according to at least one embodiment, a semiconductor storage device includes: a plurality of conductive layers arranged in a first direction; a semiconductor layer extending in the first direction, and facing the plurality of conductive layers; a charge storage layer provided between the plurality of conductive layers and the semiconductor layer; a first structure disposed apart from the semiconductor layer in a second direction intersecting the first direction, extending in a third direction intersecting the first direction and the second direction, and facing the plurality of conductive layers; and a plurality of first nitride films containing nitrogen (N), and covering surfaces of the plurality of conductive layers facing the first structure.

Next, a semiconductor storage device according to at least one embodiment will be described in detail with reference to the drawings. The following embodiments are only examples, and are not intended to limit the present disclosure. The following drawings are schematic, and some configurations or the like may be omitted for the convenience of description. Common portions of a plurality of embodiments will be denoted by the same reference signs, and the description thereof may be omitted.

The term "semiconductor storage device" used in this specification may indicate a memory die, or may indicate a memory system including a controller die such as a memory chip, a memory card, a solid state drive (SSD), or the like. The term "semiconductor storage device" may also indicate a configuration including a host computer such as a smart phone, a tablet terminal, a personal computer, or the like.

In this specification, when it is described that a first configuration is "connected between" a second configuration and a third configuration, this description may indicate that the first configuration, the second configuration, and the third configuration are connected to each other in series, and the second configuration is connected to the third configuration via the first configuration.

In this specification, a predetermined direction parallel to an upper surface of a substrate is referred to as an X direction, a direction parallel to the upper surface of the substrate and perpendicular to the X direction is referred to as a Y direction, and a direction perpendicular to the upper surface of the substrate is referred to as a Z direction.

In this specification, a direction along a predetermined surface may be referred to as a first direction, a direction intersecting the first direction along the predetermined surface may be referred to as a second direction, and a direction intersecting the predetermined surface may be referred to as a third direction. The first direction, the second direction, and the third direction may or may not correspond to any one of the X direction, the Y direction, and the Z direction.

In this specification, descriptions such as "top" and "bottom" are based on the substrate. For example, a direction away from the substrate along the Z direction is referred to as "top", and a direction approaching the substrate along the Z direction is referred to as "bottom". When a lower surface and a lower end of a certain configuration are described, the description indicates a surface and an end portion of a substrate side of this configuration, and when an upper surface and an upper end thereof are described, this description indicates a surface and an end portion on an opposite side of the substrate of this configuration. A surface intersecting the X direction or the Y direction is referred to as a side surface or the like.

In this specification, when a "width", a "length", a "thickness", or the like in a predetermined direction are described with respect to a configuration, a member, or the like, this description may indicate a width, a length, a thickness, or the like in a cross section observed by scanning electron microscopy (SEM), transmission electron microscopy (TEM), or the like.

First Embodiment

FIG. 1 is a schematic circuit diagram illustrating a partial configuration of a semiconductor storage device according to a first embodiment. The semiconductor storage device according to the first embodiment includes a memory cell array MCA and a peripheral circuit PC.

The memory cell array MCA includes a plurality of memory blocks BLK. The plurality of memory blocks BLK respectively include a plurality of string units SU. The plurality of string units SU respectively include a plurality of memory strings MS. One ends of the plurality of memory strings MS are respectively connected to the peripheral circuit PC via a bit line BL. The other ends of the plurality of memory strings MS are respectively connected to the peripheral circuit PC via a common source line SL.

The memory string MS includes a drain-side select transistor STD, a plurality of memory cells MC (memory transistors), and a source-side select transistor STS. The drain-side select transistor STD, the plurality of memory cells MC, and the source-side select transistor STS are connected to each other in series between the bit line BL and the source line SL. Hereinafter, the drain-side select transistor STD and the source-side select transistor STS may be simply referred to as select transistors (STD and STS).

The memory cell MC is a field effect transistor. The memory cell MC includes a semiconductor layer, a gate insulating film, and a gate electrode. The semiconductor layer functions as a channel region. The gate insulating film includes a charge storage film. A threshold voltage of the memory cell MC changes depending on the amount of charge in the charge storage film. The memory cell MC stores one bit or a plurality of bits of data. A word line WL is connected to each of the gate electrodes of the plurality of memory cells MC corresponding to one memory string MS. These word lines WL are, in common, connected to all memory strings MS in one memory block BLK, respectively.

The select transistors (STD and STS) are field effect transistors. The select transistors (STD and STS) include a semiconductor layer, a gate insulating film, and a gate electrode. The semiconductor layer functions as a channel region. Select gate lines (SGD and SGS) are respectively connected to gate electrodes of the select transistors (STD and STS). One drain-side select gate line SGD is, in common, connected to all memory strings MS in one string unit SU. One source-side select gate line SGS is, in common, connected to all memory strings MS in one memory block BLK.

The peripheral circuit PC includes, for example, a voltage generating circuit that generates an operating voltage, a voltage transfer circuit that transfers the generated operating voltage to the selected bit line BL, word line WL, source line SL, select gate lines (SGD and SGS), or the like, a sense amplifier module connected to the bit line BL, and a sequencer that controls the above-described units.

Figure 2:
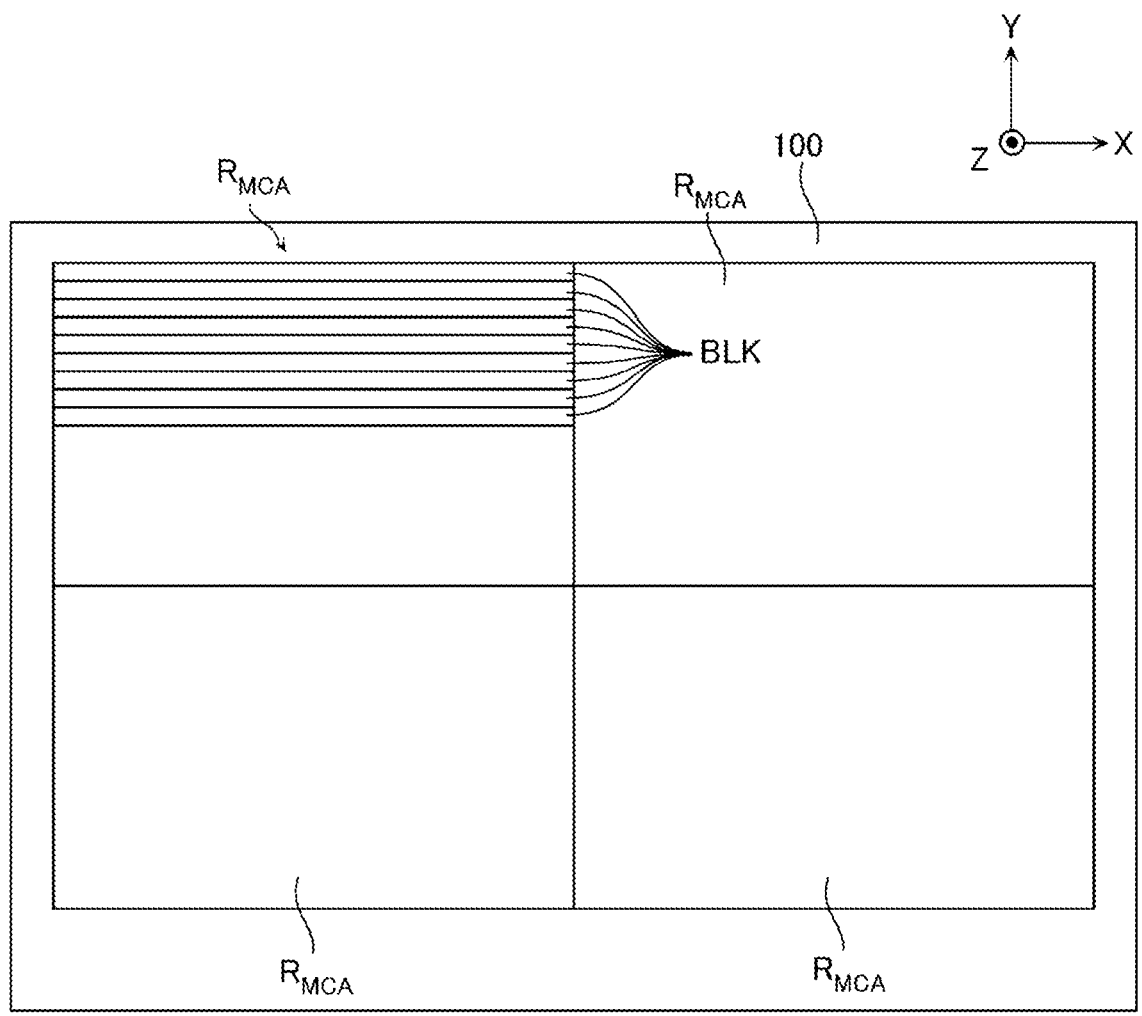
FIG. 2 is a schematic plan view illustrating a partial configuration of the semiconductor storage device.

FIG. 2 is a schematic plan view illustrating a partial configuration of the semiconductor storage device according to the first embodiment. The semiconductor storage device according to the embodiment includes a semiconductor substrate 100. The semiconductor substrate 100 is, for example, a semiconductor substrate formed of P-type silicon (Si) containing a P-type impurities such as boron (B) or the like. In the illustrated example, the semiconductor substrate 100 includes four memory cell array regions $R_{MCA}$ arranged in the X and Y directions. Each memory cell array region $R_{MCA}$ includes a plurality of memory blocks BLK arranged in the Y direction.

Figure 3:
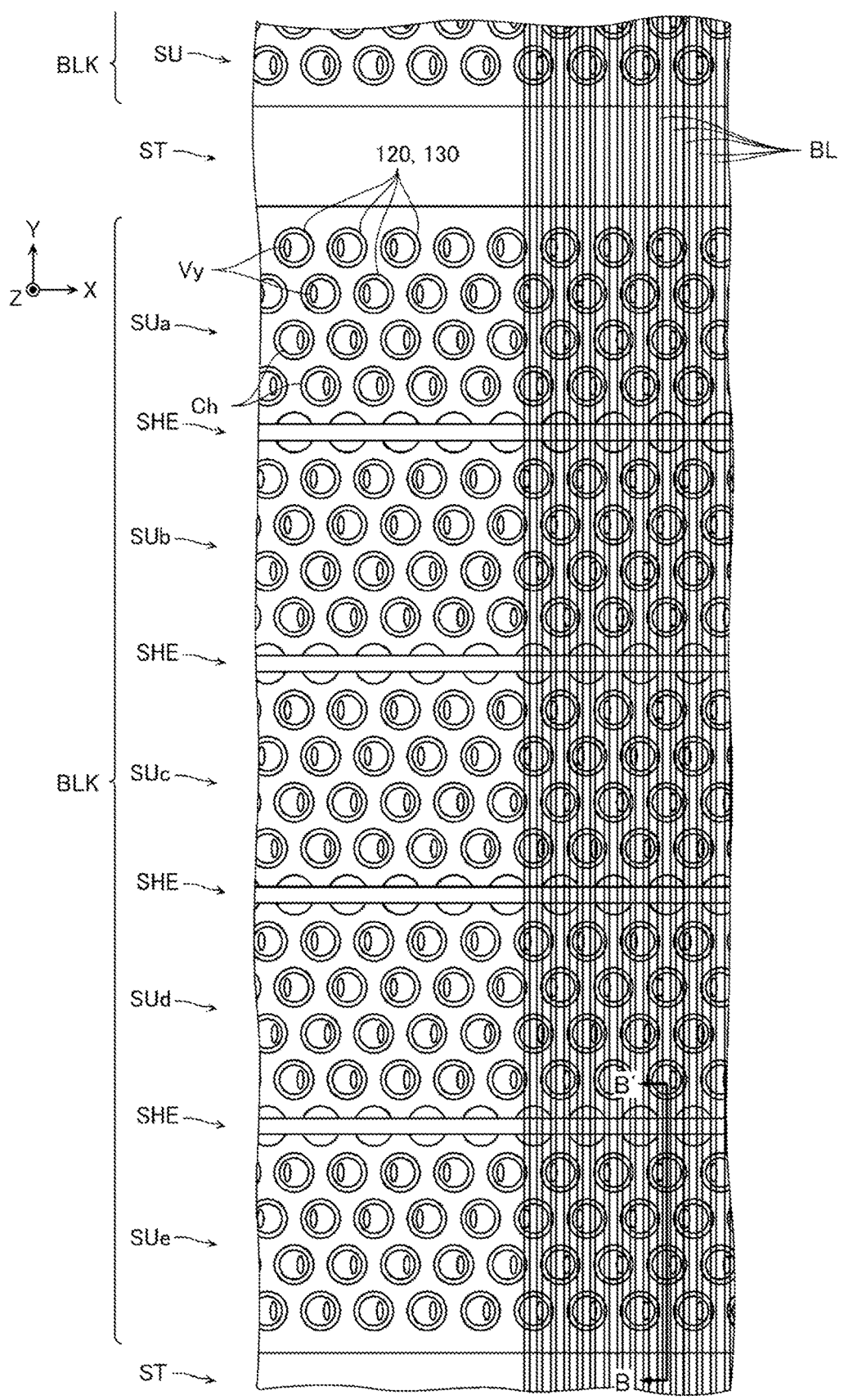
FIG. 3 is a schematic plan view illustrating a partial configuration of the semiconductor storage device.

FIG. 3 is a schematic plan view illustrating a partial configuration of the semiconductor storage device according to the first embodiment. In the example of FIG. 3, the memory block BLK includes five string units SUa to SUe provided from one side in the Y direction (a positive side in the Y direction in FIG. 3) to the other side in the Y direction (a negative side in the Y direction in FIG. 3). Each of the plurality of string units SUa to SUe corresponds to the string unit SU described with reference to FIG. 1. A string unit-to-string unit insulating layer SHE such as silicon oxide (SiO$_2$) or the like is provided between two string units SU adjacent to each other in the Y direction. A block-to-block structure ST is provided between two memory blocks BLK adjacent to each other in the Y direction.

Figure 4:
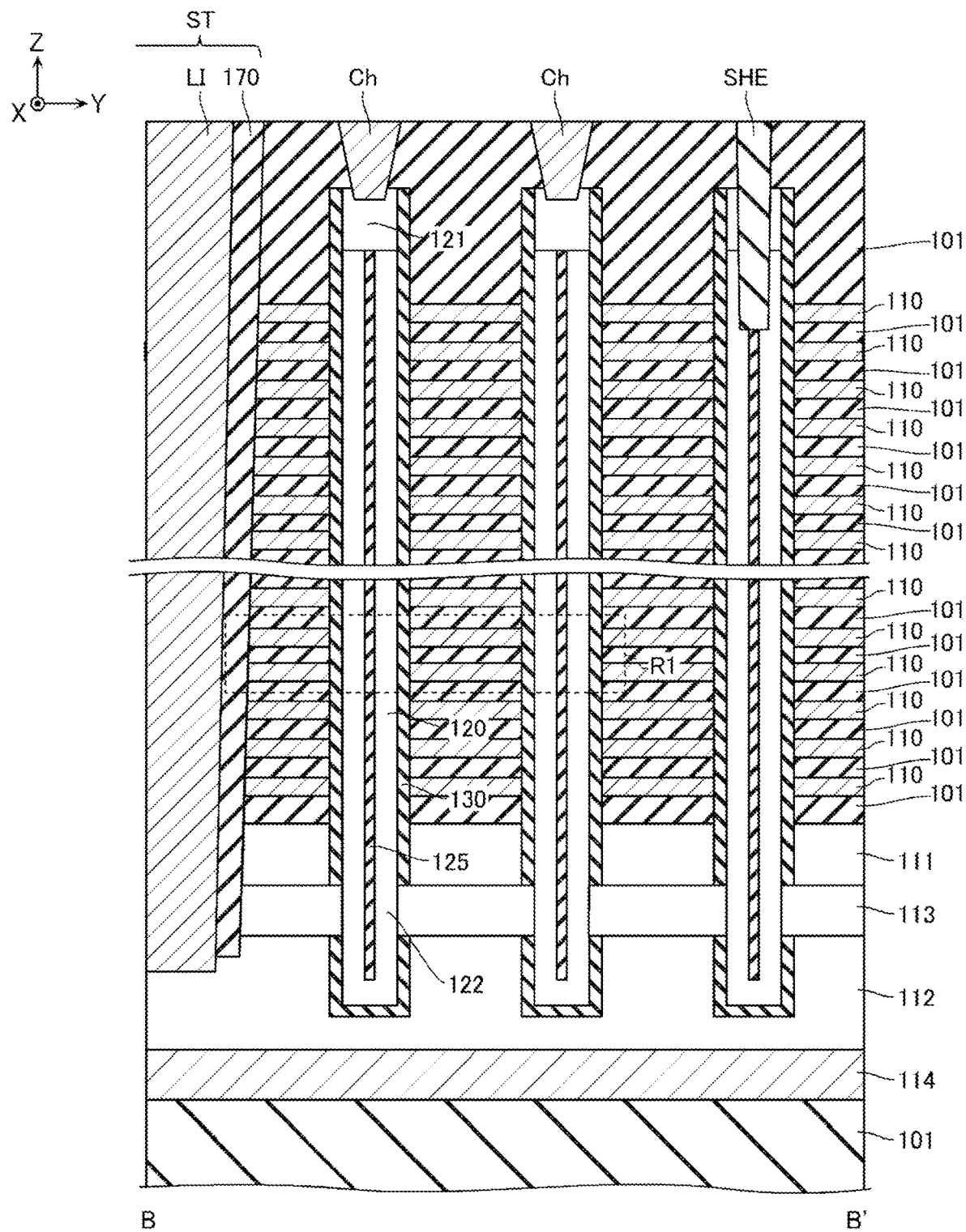
FIG. 4 is a schematic cross-sectional view illustrating a partial configuration of the semiconductor storage device.
Figure 5:
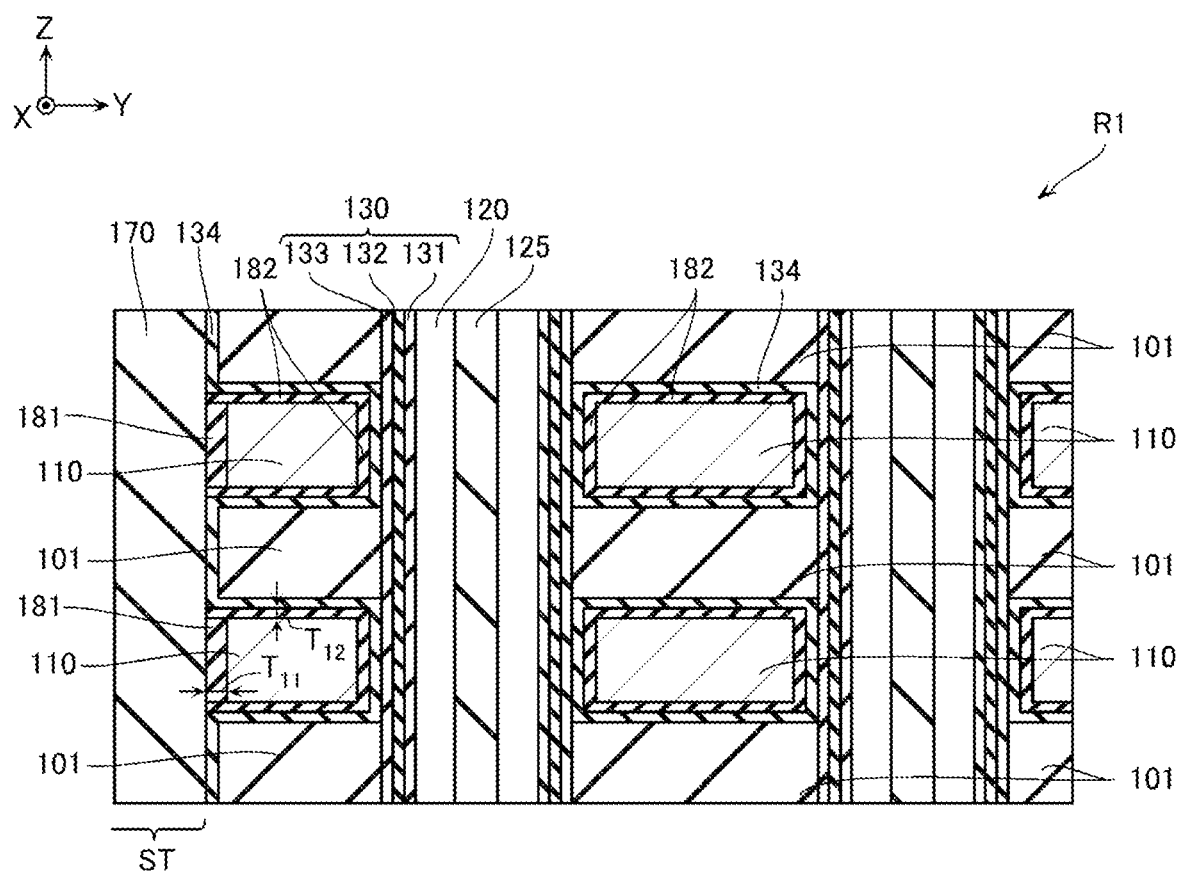
FIG. 5 is a schematic cross-sectional view illustrating a partial configuration of the semiconductor storage device.

FIG. 4 is a schematic cross-sectional view of the configuration illustrated in FIG. 3 taken along a line B-B' and viewed along an arrow direction. FIG. 5 is a schematic cross-sectional view illustrating a region R1 illustrated in FIG. 4 in an enlarged manner.

As illustrated in FIG. 4, the memory block BLK includes a plurality of conductive layers 110 arranged in the Z direction, a plurality of semiconductor layers 120 extending in the Z direction, and a plurality of gate insulating layers 130 respectively provided between the plurality of conductive layers 110 and the plurality of semiconductor layers 120.

The conductive layer 110 is an approximately plate-shaped conductive layer extending in the X direction. The conductive layer 110 contains at least one of molybdenum (Mo), tungsten (W), and ruthenium (Ru). As illustrated in FIG. 5, a nitride film 181 is provided on a side surface of the conductive layer 110 in the Y direction. A stacked film including a nitride film 182 and an insulating layer 134 is provided on upper and lower surfaces of the conductive layer 110 and a surface facing the semiconductor layer 120. A configuration, in which the nitride film 181 is provided on the side surface of the conductive layer 110 in the Y direction, and the stacked film is provided in the upper and lower surfaces thereof and the surface facing the semiconductor layer 120, will be described later. An insulating layer 101 such as silicon oxide (SiO$_2$) or the like is provided between the plurality of conductive layers 110 arranged in the Z direction.

As illustrated in FIG. 4, a semiconductor layer 111, a semiconductor layer 113, and a semiconductor layer 112 are provided below the plurality of conductive layers 110 via the insulating layer 101. A part of the gate insulating layer 130 is provided between the semiconductor layer 111, the semiconductor layer 112, and the semiconductor layer 120. The semiconductor layer 113 is connected to a lower end portion of the semiconductor layer 120.

An upper surface of the semiconductor layer 113 is connected to the semiconductor layer 111, and a lower surface thereof is connected to the semiconductor layer 112. A conductive layer 114 may be provided on a lower surface of the semiconductor layer 112. The semiconductor layer 111, the semiconductor layer 113, the semiconductor layer 112, and the conductive layer 114 function as the source line SL (FIG. 1). For example, the source line SL is provided in common for all the memory blocks BLK in the memory cell array region R$_{MCA}$ (FIG. 2). The semiconductor layer 111, the semiconductor layer 113, and the semiconductor layer 112 include, for example, polycrystalline silicon containing impurities such as phosphorus (P) or boron (B). The conductive layer 114 may include, for example, a metal such as tungsten (W) or the like, a conductive layer such as tungsten silicide or the like, or other conductive layers.

Among the plurality of conductive layers 110, one or a plurality of conductive layers 110 located at the lowest layer function as gate electrodes of the source-side select gate line SGS (FIG. 1) and the plurality of source-side select transistors STS (FIG. 1) connected thereto. The conductive layer 110 is electrically independent for each memory block BLK.

The plurality of conductive layers 110 located thereabove function as gate electrodes of the word line WL (FIG. 1) and the plurality of memory cells MC connected thereto (FIG. 1). The plurality of conductive layers 110 are electrically independent for each memory block BLK, respectively.

One or a plurality of conductive layers 110 located thereabove function as gate electrodes of the drain-side select gate line SGD (FIG. 1) and a plurality of drain-side select transistors STD (FIG. 1) connected thereto. A width of the plurality of conductive layers 110 in the Y direction is smaller than that of other conductive layers 110. The string unit-to-string unit insulating layer SHE is provided between two conductive layers 110 adjacent to each other in the Y direction. The plurality of conductive layers 110 are electrically independent for each string unit SU, respectively.

As illustrated in FIG. 3, for example, the semiconductor layers 120 are arranged in a predetermined pattern in the X and Y directions. As illustrated in FIG. 4, for example, the semiconductor layer 120 has an approximately bottomed cylindrical shape, and an insulating layer 125 such as silicon oxide or the like is provided in a central portion thereof. An outer peripheral surface of the semiconductor layer 120 is surrounded by a plurality of conductive layers 110, and faces the plurality of conductive layers 110. The semiconductor layer 120 functions as a channel region of the plurality of memory cells MC and select transistors (STD and STS) in one memory string MS (FIG. 1). The semiconductor layer 120 is, for example, a semiconductor layer such as polycrystalline silicon (Si) or the like.

An impurity region 121 is connected to an upper end of the semiconductor layer 120. The impurity region 121 contains, for example, N-type impurities such as phosphorus (P) or the like. The impurity region 121 is connected to the bit line BL via a contact Ch, a contact Vy, or the like.

An impurity region 122 is provided at a lower end portion of the semiconductor layer 120. The impurity region 122 contains, for example, the N-type impurities such as phosphorus (P) or the like, or the P-type impurities such as boron (B) or the like.

The gate insulating layer 130 has an approximately cylindrical shape that covers the outer peripheral surface of the semiconductor layer 120. As illustrated in FIG. 5, the gate insulating layer 130 includes, for example, a tunnel insulating film 131, a charge storage film 132, and a block insulating film 133 stacked between the semiconductor layer 120 and the conductive layer 110. The tunnel insulating film 131 and the block insulating film 133 are, for example, insulating films such as silicon oxide (SiO$_2$) or the like. The charge storage film 132 is, for example, silicon nitride (Si$_3$N$_4$) or the like, and is a film capable of storing charges. The tunnel insulating film 131, the charge storage film 132, and the block insulating film 133 have an approximately cylindrical shape and extend in the Z direction along the outer peripheral surface of the semiconductor layer 120.

The gate insulating layer 130 may include, for example, a floating gate such as polycrystalline silicon containing the N-type impurities or the P-type impurities.

For example, as illustrated in FIGS. 3 and 4, the block-to-block structure ST extends in the Z and X directions. For example, as illustrated in FIG. 4, the block-to-block structure ST is a structure that divides the plurality of insulating layers 101, the plurality of conductive layers 110, the semiconductor layer 111, and the semiconductor layer 113 in the Y direction, and reaches the semiconductor layer 112. The block-to-block structure ST may include an insulating layer 170 such as silicon oxide (SiO$_2$) or the like and a conductive layer LI such as tungsten (W) or the like. A lower end of the conductive layer LI is connected to the semiconductor layer 112.

Nitride Films 181 and 182

As described above with reference to FIG. 5, the nitride film 181 containing nitrogen (N) is provided on the side surface of the conductive layer 110 in the Y direction. The conductive layer 110 faces the block-to-block structure ST via the nitride film 181.

The nitride film 181 is a film showing insulating properties or a film showing high resistance and conductivity. The nitride film 181 contains, for example, at least one of molybdenum (Mo), ruthenium (Ru), tungsten (W), silicon (Si), and aluminum (Al). The nitride film 181 may be, for example, molybdenum nitride (MoN), ruthenium nitride (RuN), tungsten nitride (WN), silicon nitride (SiN), aluminum nitride (AlN), or the like. For example, molybdenum nitride (MoN), ruthenium nitride (RuN), and tungsten nitride (WN) are generally films showing high resistance and conductivity.

The plurality of conductive layers 110 and nitride films 181 may contain at least one of molybdenum (Mo), tungsten (W), and ruthenium (Ru) in common. For example, when the conductive layer 110 contains molybdenum (Mo), the nitride film 181 may contain molybdenum nitride (MoN). For example, when the conductive layer 110 contains tungsten (W), the nitride film 181 may contain tungsten nitride (WN). For example, when the conductive layer 110 contains ruthenium (Ru), the nitride film 181 may contain ruthenium nitride (RuN).

As described above with reference to FIG. 5, the nitride film 182 containing nitrogen (N) is provided on one side surface and the other side surface of the conductive layer 110 in the Z direction and on the surface facing the semiconductor layer 120.

The nitride film 182 is a film showing insulating properties or a film showing high resistance and conductivity. The nitride film 182 contains at least one of molybdenum (Mo), ruthenium (Ru), tungsten (W), silicon (Si), and aluminum (Al). For example, the nitride film 182 may be molybdenum nitride (MoN), ruthenium nitride (RuN), tungsten nitride (WN), silicon nitride (SiN), aluminum nitride (AlN), or the like. For example, molybdenum nitride (MoN), ruthenium nitride (RuN), and tungsten nitride (WN) are generally films showing high resistance and conductivity.

The plurality of conductive layers 110 and nitride films 182 may contain at least one of molybdenum (Mo), tungsten (W), and ruthenium (Ru) in common. For example, when the conductive layer 110 contains molybdenum (Mo), the nitride film 182 may contain molybdenum nitride (MoN). For example, when the conductive layer 110 contains tungsten (W), the nitride film 182 may contain tungsten nitride (WN). For example, when the conductive layer 110 contains ruthenium (Ru), the nitride film 182 may contain ruthenium nitride (RuN).

The nitride film 181 and the nitride film 182 may contain at least one of molybdenum (Mo), ruthenium (Ru), tungsten (W), silicon (Si), and aluminum (Al) in common.

A film thickness $T_{11}$ of the nitride film 181 may be larger than a film thickness $T_{12}$ of the nitride film 182.

The film thickness $T_{11}$ of the nitride film 181 may be smaller than the film thickness $T_{12}$ of the nitride film 182.

As illustrated in FIG. 5, the insulating layer 134 is provided between the nitride film 182 and the insulating layer 101, and between the nitride film 182 and the semiconductor layer 120. The insulating layer 134 may contain at least one of aluminum (Al), hafnium (Hf), zirconium (Zr), and lanthanum (La). The insulating layer 134 may be, for example, aluminum oxide ($Al_2O_3$), hafnium oxide ($HfO_2$), zirconium oxide ($ZrO_2$), lanthanum oxide ($La_2O_3$), or the like.

Manufacturing Method

Next, a method for manufacturing the semiconductor storage device according to the first embodiment will be described with reference to FIGS. 6 to 20. FIGS. 6 to 14 are schematic cross-sectional views illustrating the manufacturing method, and illustrate a cross section corresponding to that of FIG. 4. FIGS. 15 to 20 are schematic cross-sectional views illustrating the manufacturing method, and illustrate a cross section corresponding to that of FIG. 5.

In the manufacture of the semiconductor storage device according to the first embodiment, first, the peripheral circuit PC (FIG. 1) is formed on the semiconductor substrate 100. The insulating layer 101 is formed above the peripheral circuit PC.

Figure 6:
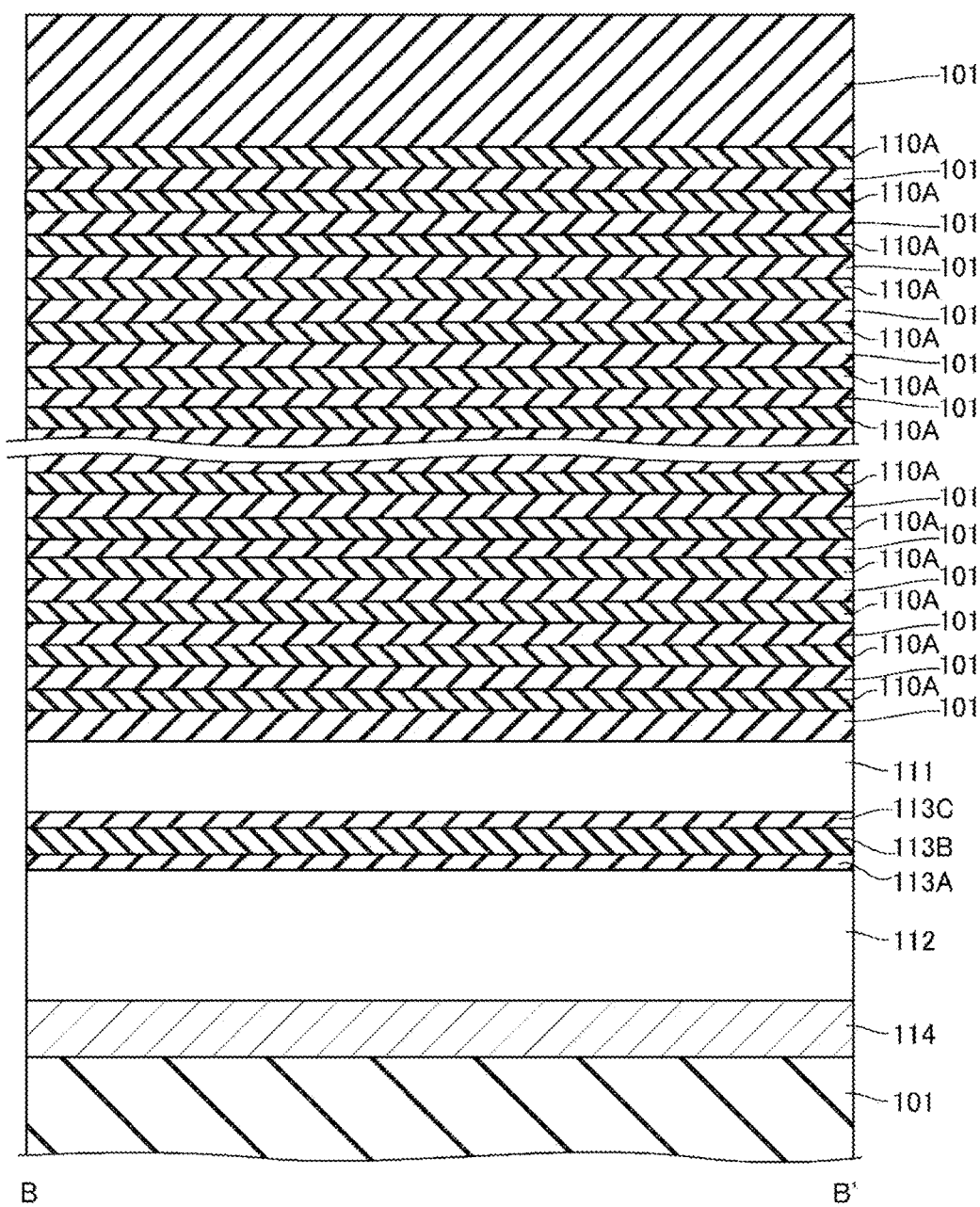
FIG. 6 is a schematic cross-sectional view illustrating a method for manufacturing the semiconductor storage device.

Next, for example, as illustrated in FIG. 6, the conductive layer 114, the semiconductor layer 112, a sacrifice layer 113A such as silicon oxide or the like, a sacrifice layer 113B such as silicon nitride or the like, a sacrifice layer 113C such as silicon oxide or the like, and the semiconductor layer 111 are formed on the insulating layer 101. Next, a plurality of insulating layers 101 and a plurality of sacrifice layers 110A are alternately formed. This step is performed by, for example, a method such as chemical vapor deposition (CVD) or the like.

Figure 7:
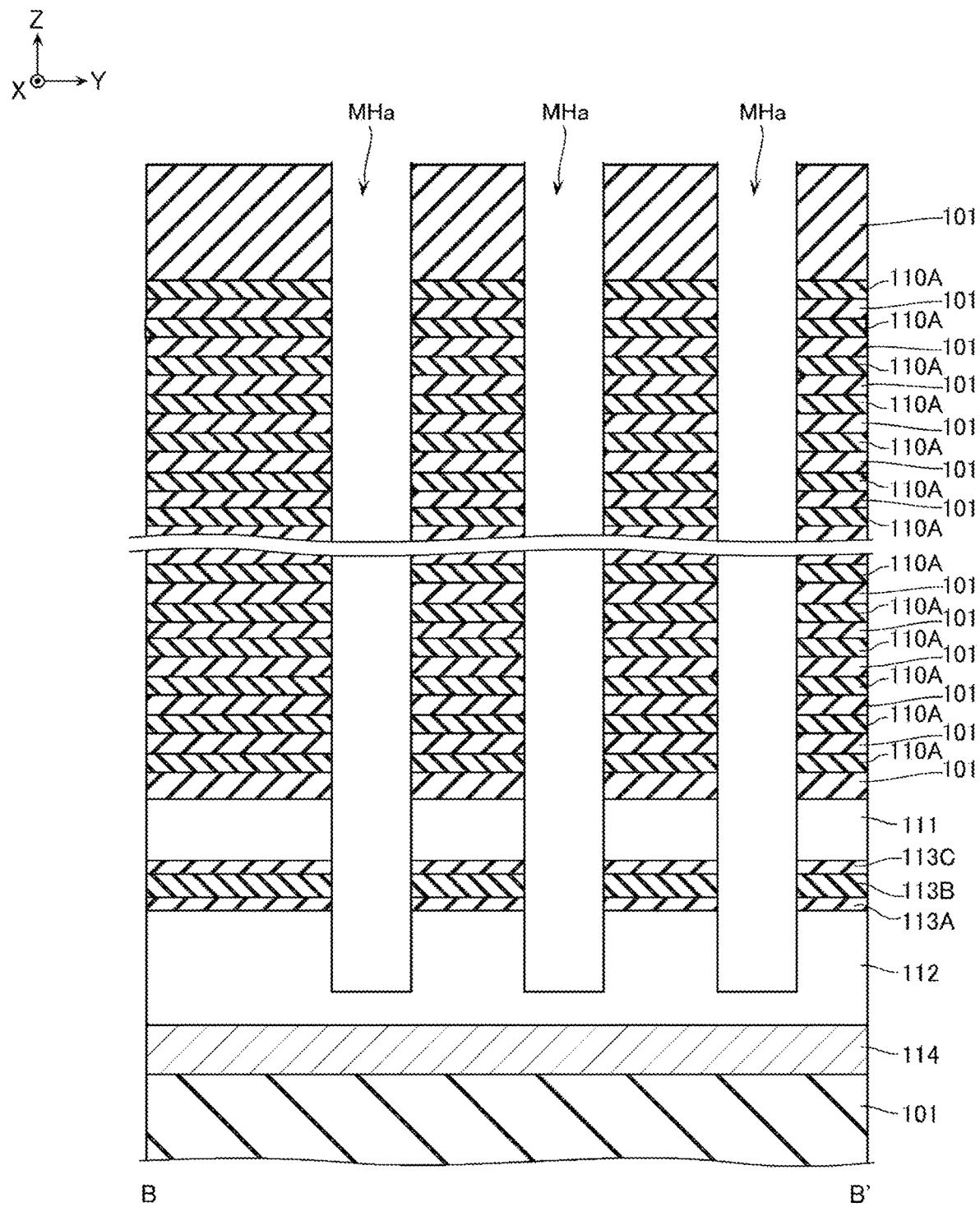
FIG. 7 is a schematic cross-sectional view illustrating a method for manufacturing the semiconductor storage device.

Next, for example, as illustrated in FIG. 7, a plurality of openings MHa are formed at locations corresponding to the semiconductor layer 120. The opening MHa extends in the Z direction, penetrates through the plurality of insulating layers 101, the plurality of sacrifice layers 110A, the semiconductor layer 111, the sacrifice layer 113C, the sacrifice layer 113B, and the sacrifice layer 113A, and exposes the semiconductor layer 112. This step is performed by, for example, a method such as reactive ion etching (RIE) or the like.

Figure 8:
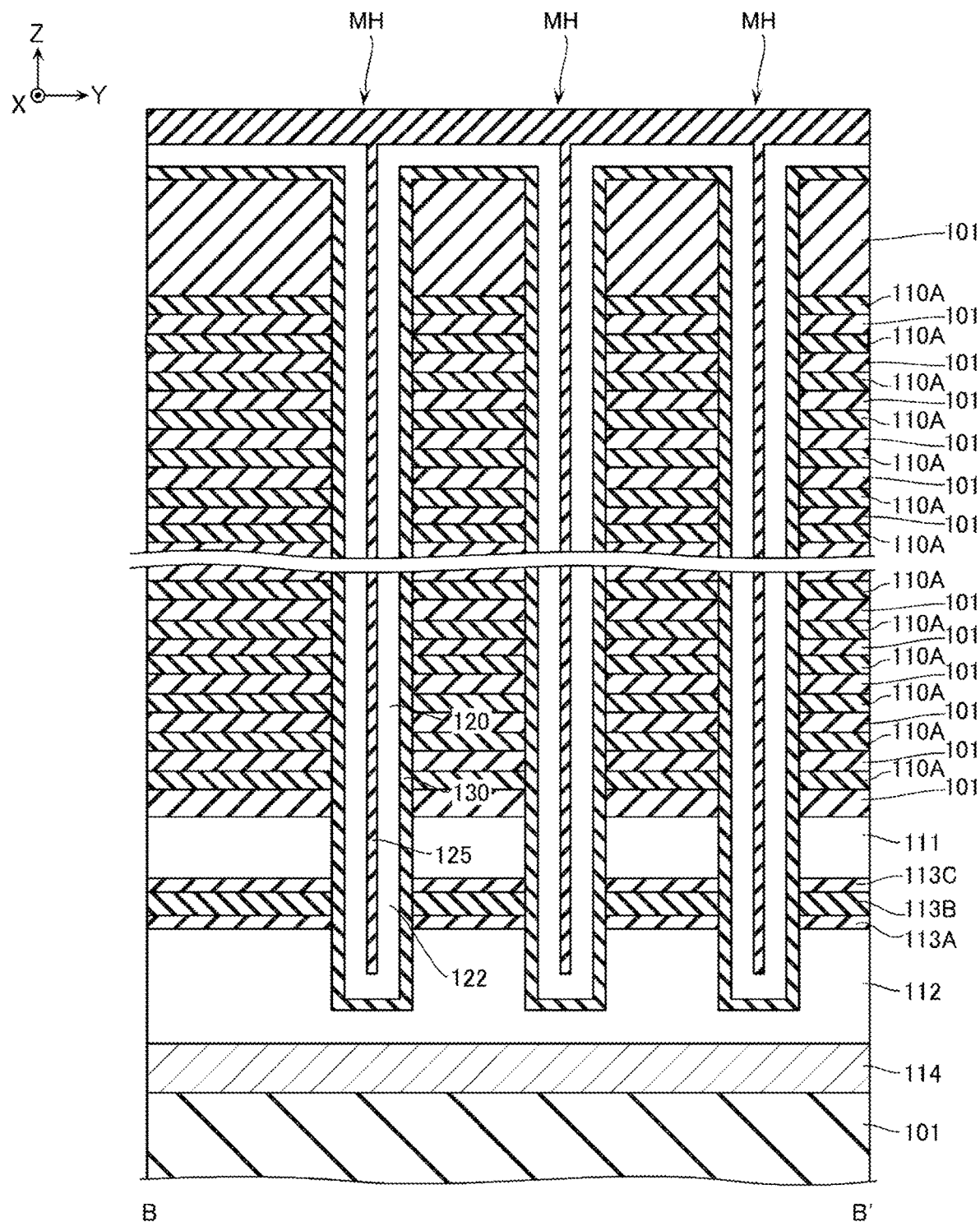
FIG. 8 is a schematic cross-sectional view illustrating a method for manufacturing the semiconductor storage device.

Next, for example, as illustrated in FIG. 8, the gate insulating layer 130, the semiconductor layer 120, and the insulating layer 125 are formed on an upper surface of the uppermost insulating layer 101 and an inner peripheral surface of the opening MHa, and a columnar structure MH is formed. When the gate insulating layer 130 is formed, for example, the block insulating film 133, the charge storage film 132, and the tunnel insulating film 131 are sequentially formed by CVD or the like. When the semiconductor layer 120 is formed, for example, a film is formed by CVD or the like, and an amorphous silicon film is formed inside the columnar structure MH. For example, a crystal structure of this amorphous silicon film is modified by an annealing treatment or the like.

Figure 9:
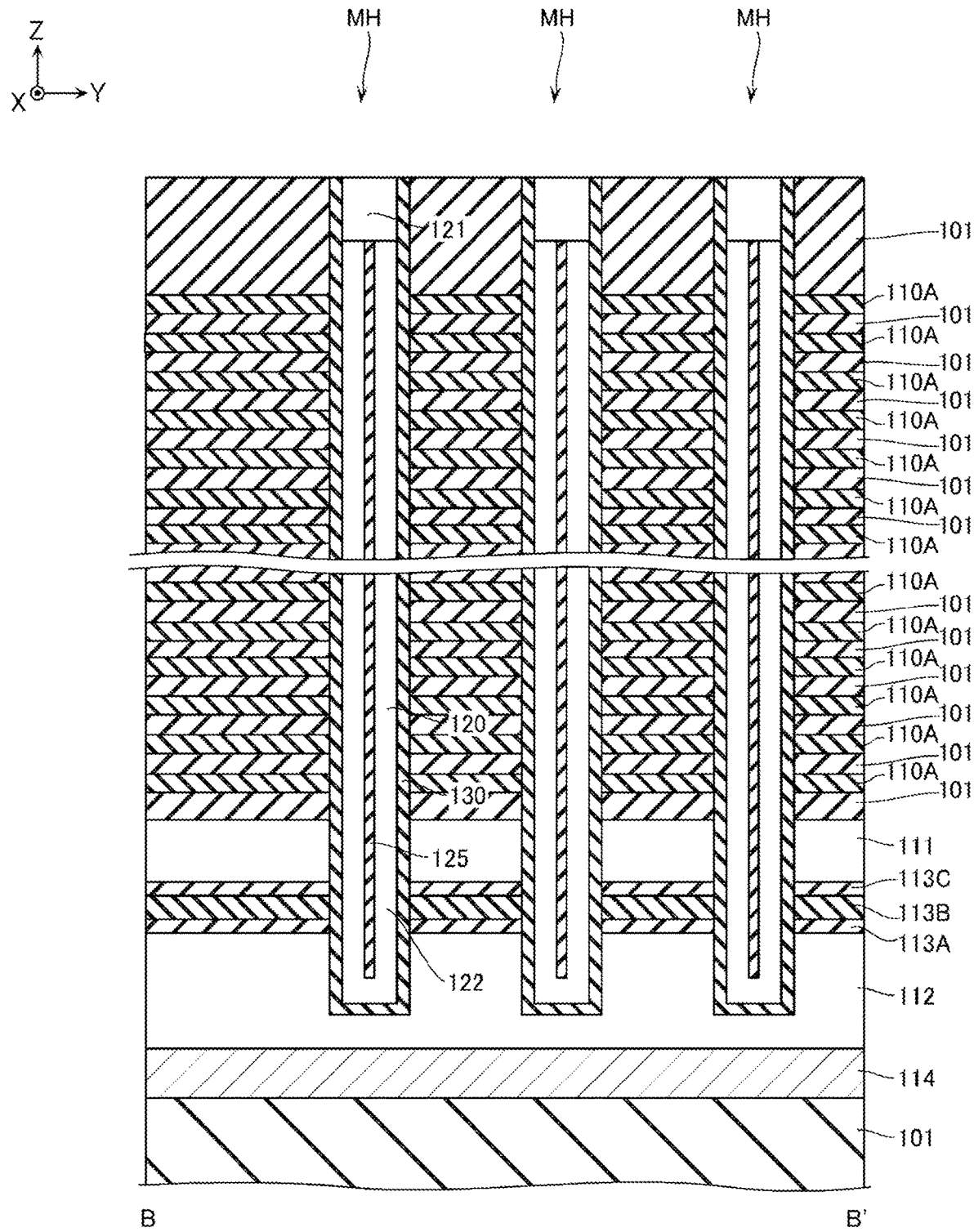
FIG. 9 is a schematic cross-sectional view illustrating a method for manufacturing the semiconductor storage device.

Next, for example, as illustrated in FIG. 9, a part of the insulating layer 125 and the semiconductor layer 120 is removed up to a location where an upper surface of the semiconductor layer 120 or the like is located between an upper surface of the uppermost insulating layer 101 and a lower surface thereof. This step is performed by, for example, a method such as RIE or the like. For example, as illustrated in FIG. 9, the impurity region 121 is formed at an upper end portion of the columnar structure MH. In this step, a semiconductor layer such as amorphous silicon or the like containing the N-type impurities such as phosphorus (P) is formed, by a method such as CVD or the like, on the upper end portion of the columnar structure MH.

Figure 10:
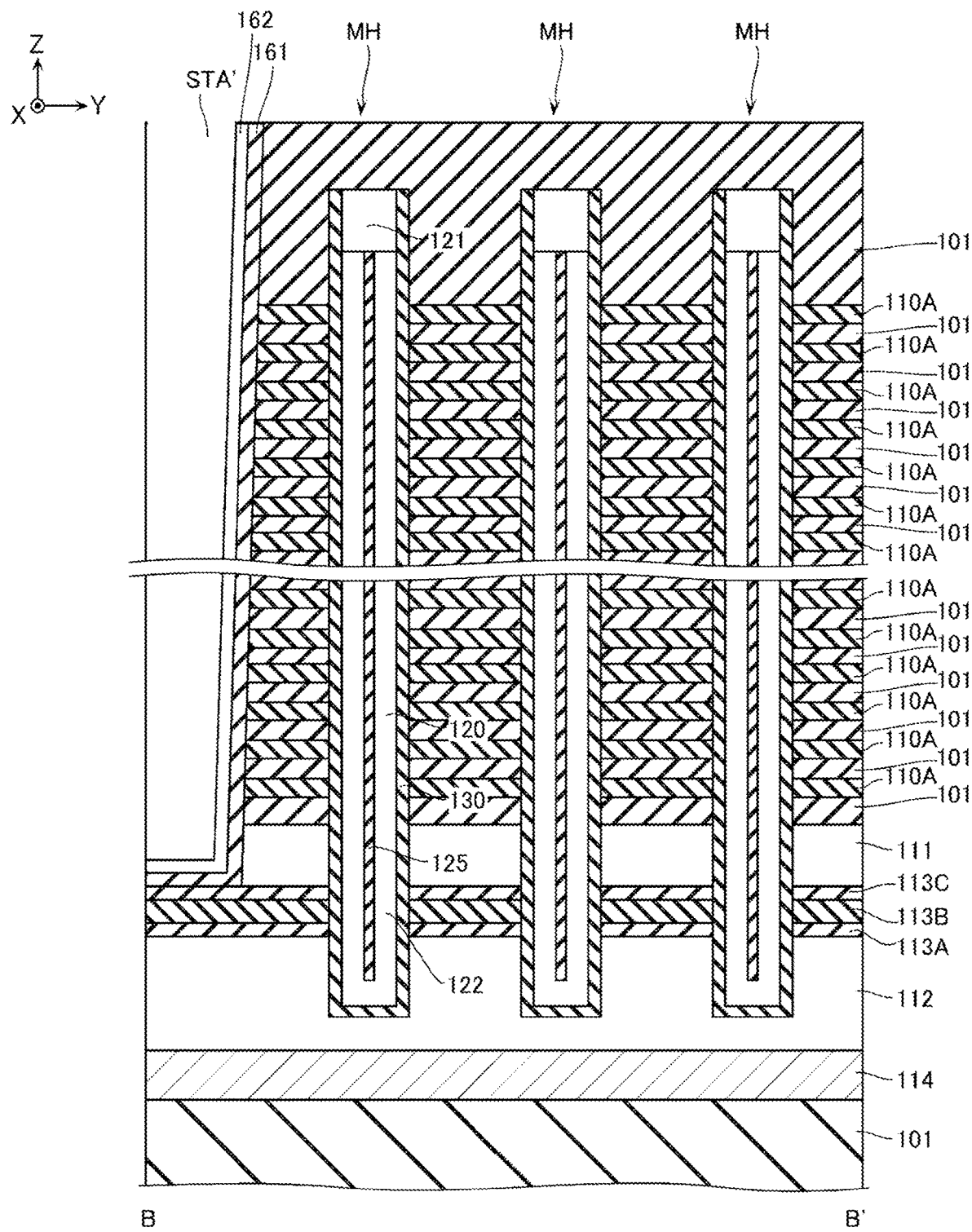
FIG. 10 is a schematic cross-sectional view illustrating a method for manufacturing the semiconductor storage device.

Next, for example, as illustrated in FIG. 10, a trench STA' is formed. The trench STA' extends in the Z and X directions, divides the plurality of insulating layers 101 and the sacrifice layers 110A in the Y direction, and exposes the semiconductor layer 111. This step is performed by, for example, a method such as RIE or the like. An insulating layer 161 such as silicon oxide or the like and a semiconductor layer 162 such as amorphous silicon or the like are formed on an inner wall of the trench STA' by a method such as CVD or the like.

Figure 11:
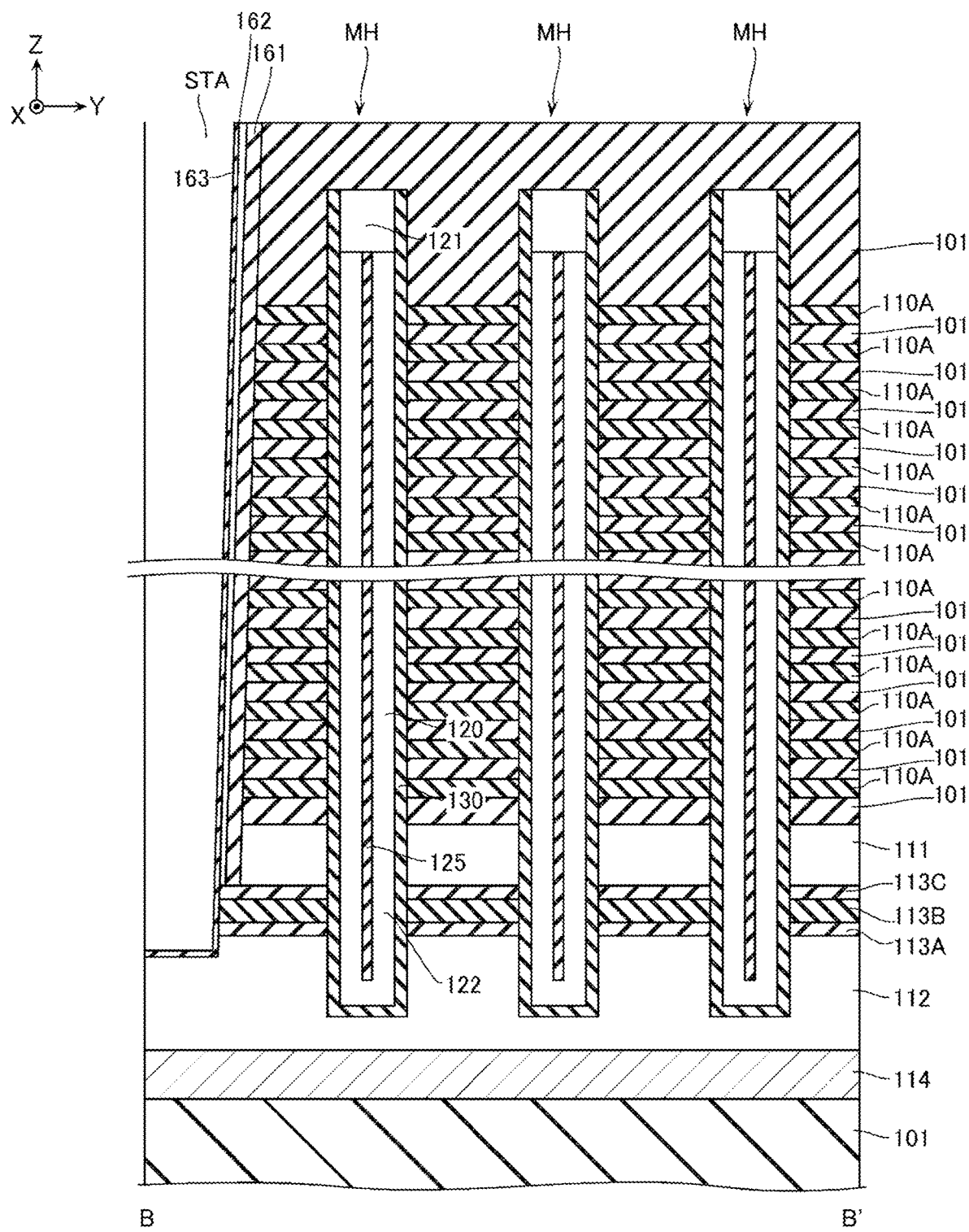
FIG. 11 is a schematic cross-sectional view illustrating a method for manufacturing the semiconductor storage device.

Next, for example, as illustrated in FIG. 11, a trench STA is formed. The trench STA further divides the semiconductor layer 162, the insulating layer 161, the semiconductor layer 111, and the sacrifice layers 113C, 113B, and 113A in the Y direction from a bottom surface of the trench STA', and exposes the semiconductor layer 112. This step is performed by, for example, RIE or the like. The semiconductor layer 162 on a side surface of the trench STA in the Y direction and a part of the semiconductor layer 112 exposed to the bottom surface are oxidized to form an insulating layer 163 such as silicon oxide or the like. This step is performed by, for example, thermal oxidation or the like.

Figure 12:
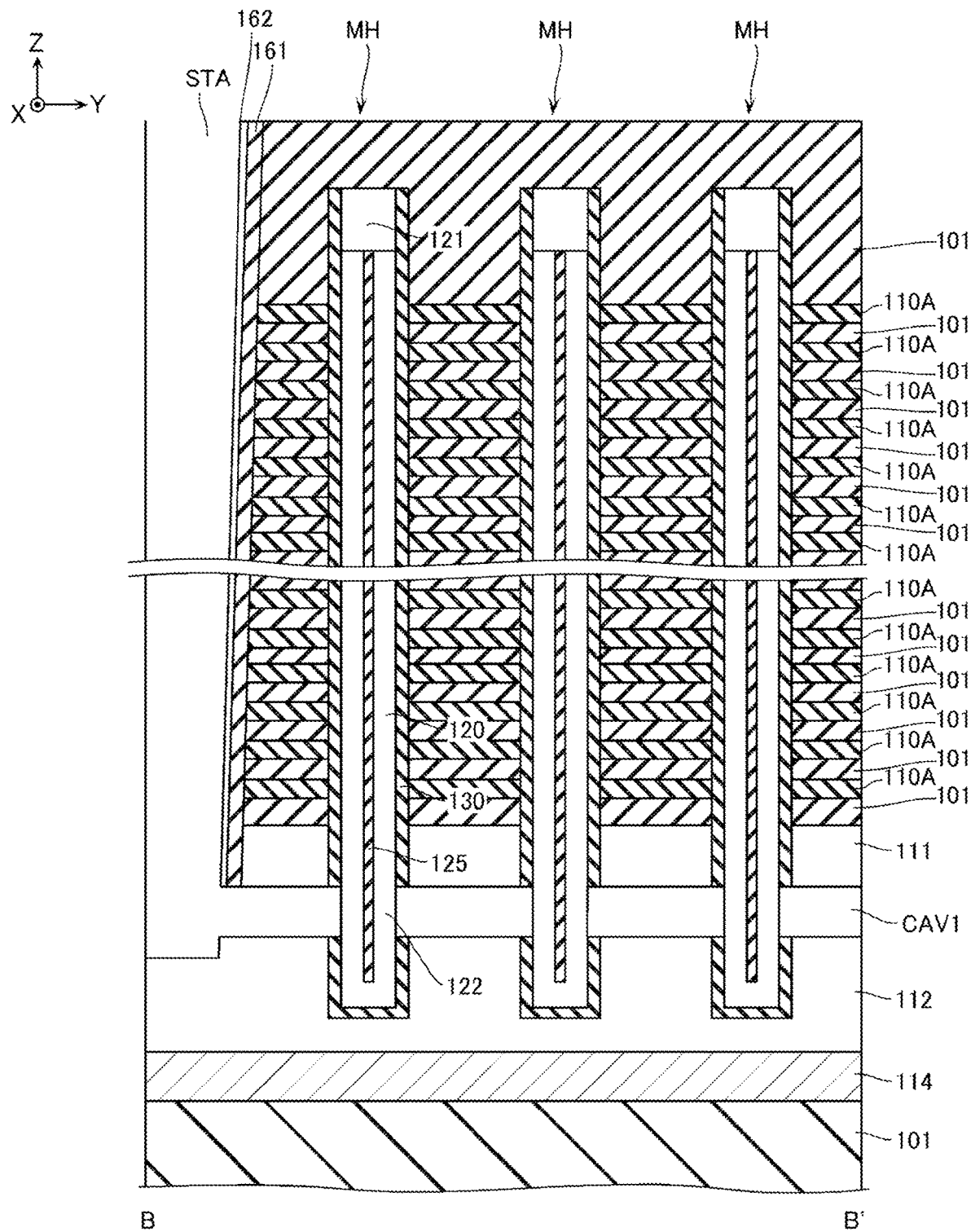
FIG. 12 is a schematic cross-sectional view illustrating a method for manufacturing the semiconductor storage device.

Next, for example, as illustrated in FIG. 12, the sacrifice layer 113B is removed via the trench STA, and then the sacrifice layers 113A and 113C and a part of the gate insulating layer 130 are removed to form a cavity CAV1, thereby exposing a part of the semiconductor layer 120. This step is performed by, for example, a method such as wet etching or the like.

Figure 13:
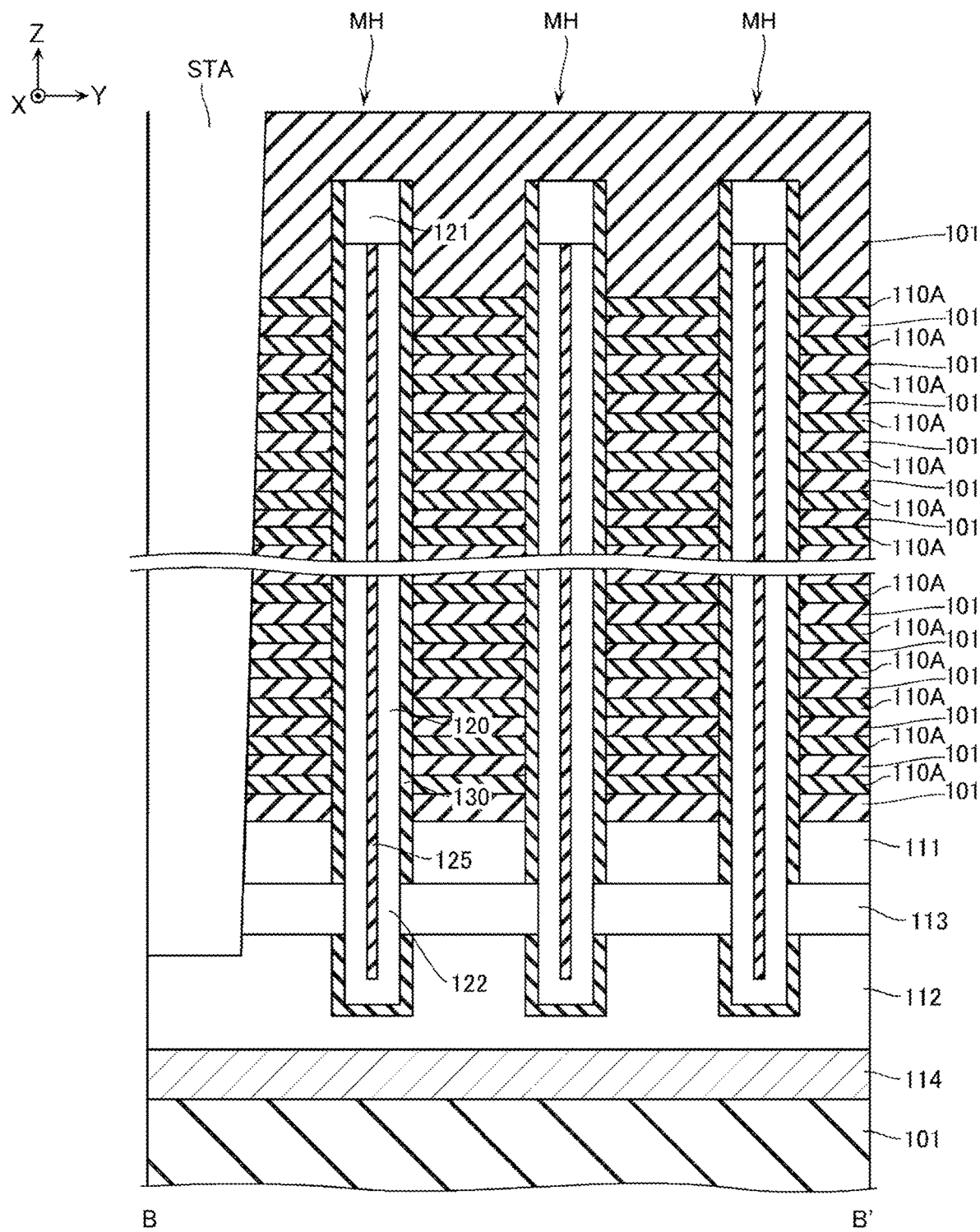
FIG. 13 is a schematic cross-sectional view illustrating a method for manufacturing the semiconductor storage device.

Next, as illustrated in FIG. 13, for example, the semiconductor layer 113 is formed at a location where the cavity CAV1 is formed via the trench STA. This step is performed by, for example, a method such as epitaxial growth or the like. The semiconductor layer 162 and the insulating layer 161 provided on the side surface of the trench STA in the Y direction are removed. This step is performed by, for example, a method such as wet etching or the like.

Figure 14:
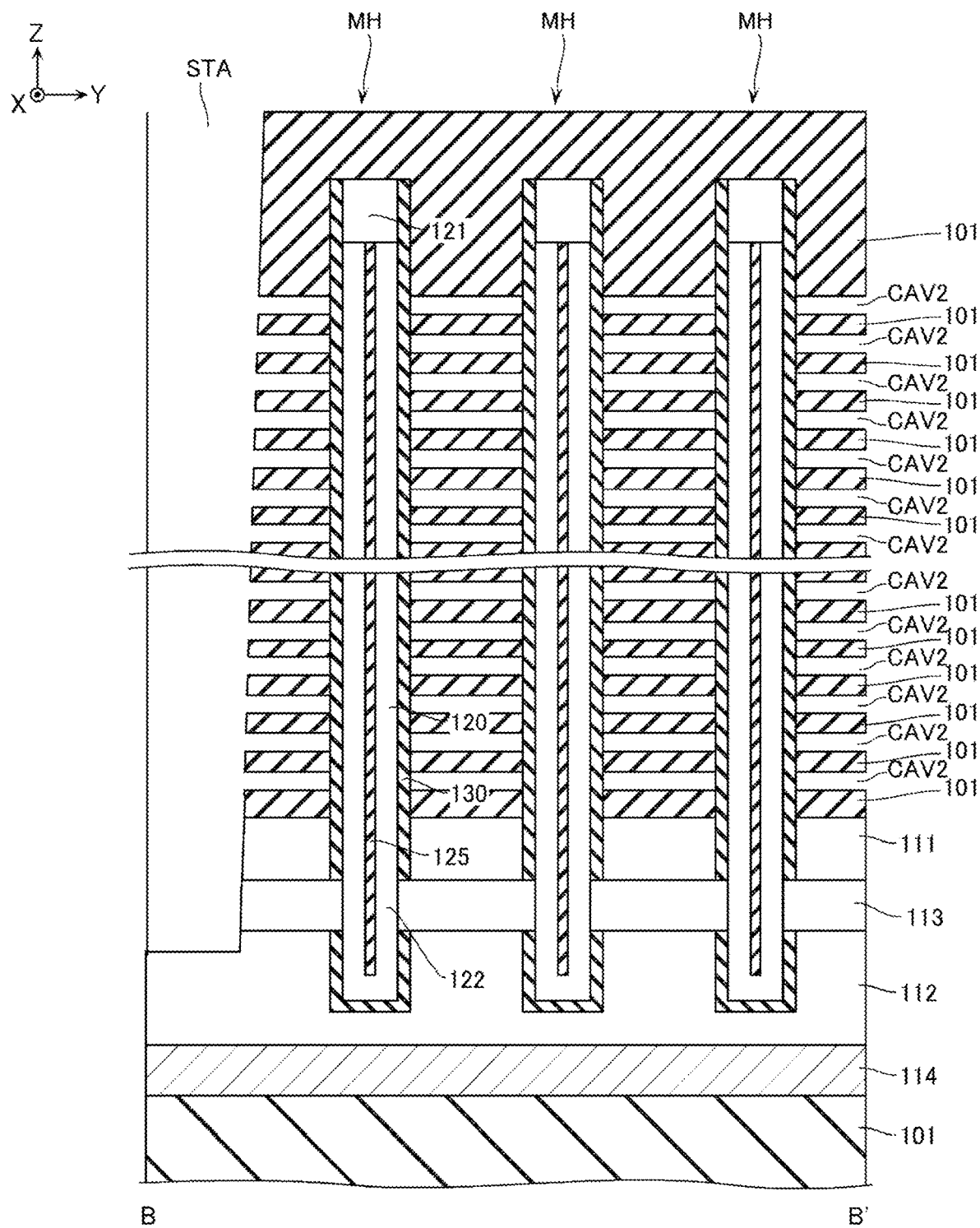
FIG. 14 is a schematic cross-sectional view illustrating a method for manufacturing the semiconductor storage device.

Next, as illustrated in FIG. 14, for example, the sacrifice layer 110A is removed via the trench STA, thereby forming a plurality of cavities CAV2. Accordingly, a hollow structure including a plurality of insulating layers 101 arranged in the Z direction and the columnar structure MH supporting the insulating layer 101 is formed. This step is performed by, for example, a method such as wet etching or the like.

Figure 15:
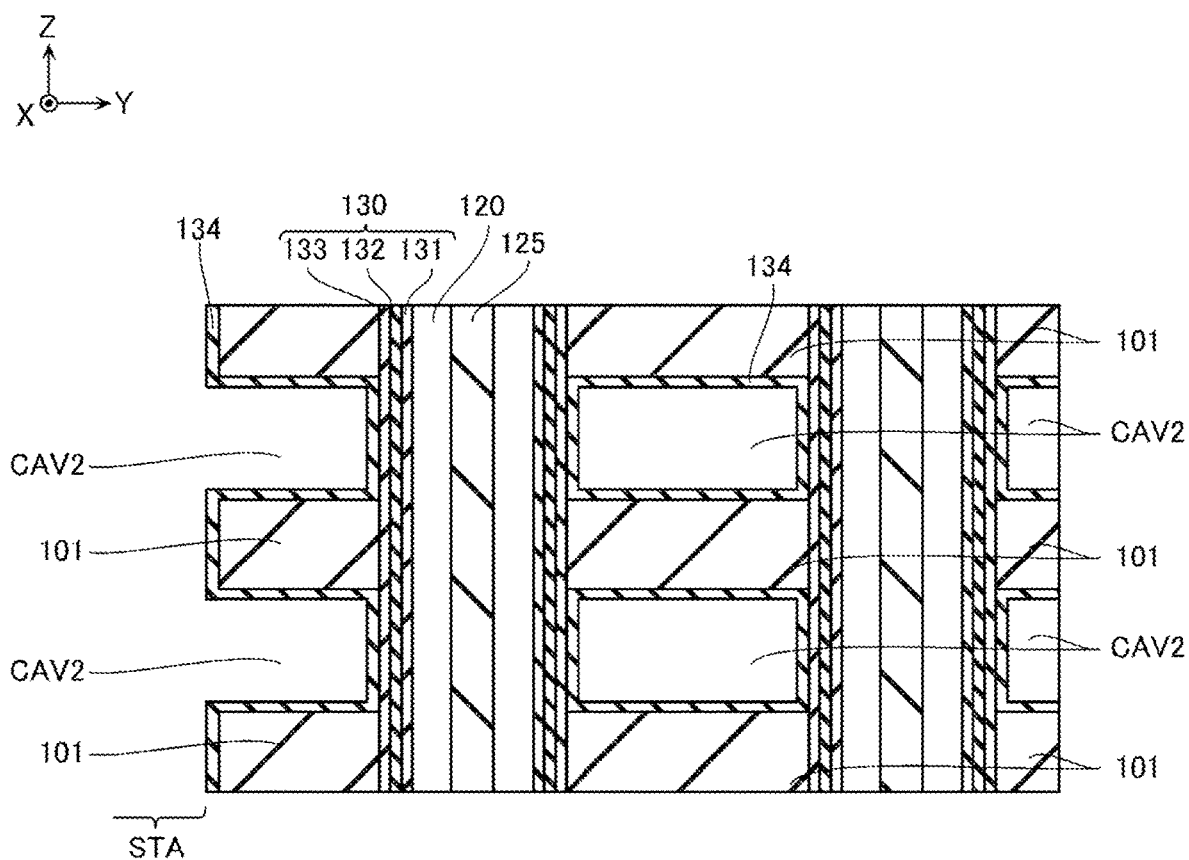
FIG. 15 is a schematic cross-sectional view illustrating a method for manufacturing the semiconductor storage device.

Next, for example, as illustrated in FIG. 15, the insulating layer 134 is formed on an inner wall of the cavity CAV2 and an inner wall of the trench STA via the trench STA. This step is performed by, for example, a method such as CVD or the like.

Figure 16:
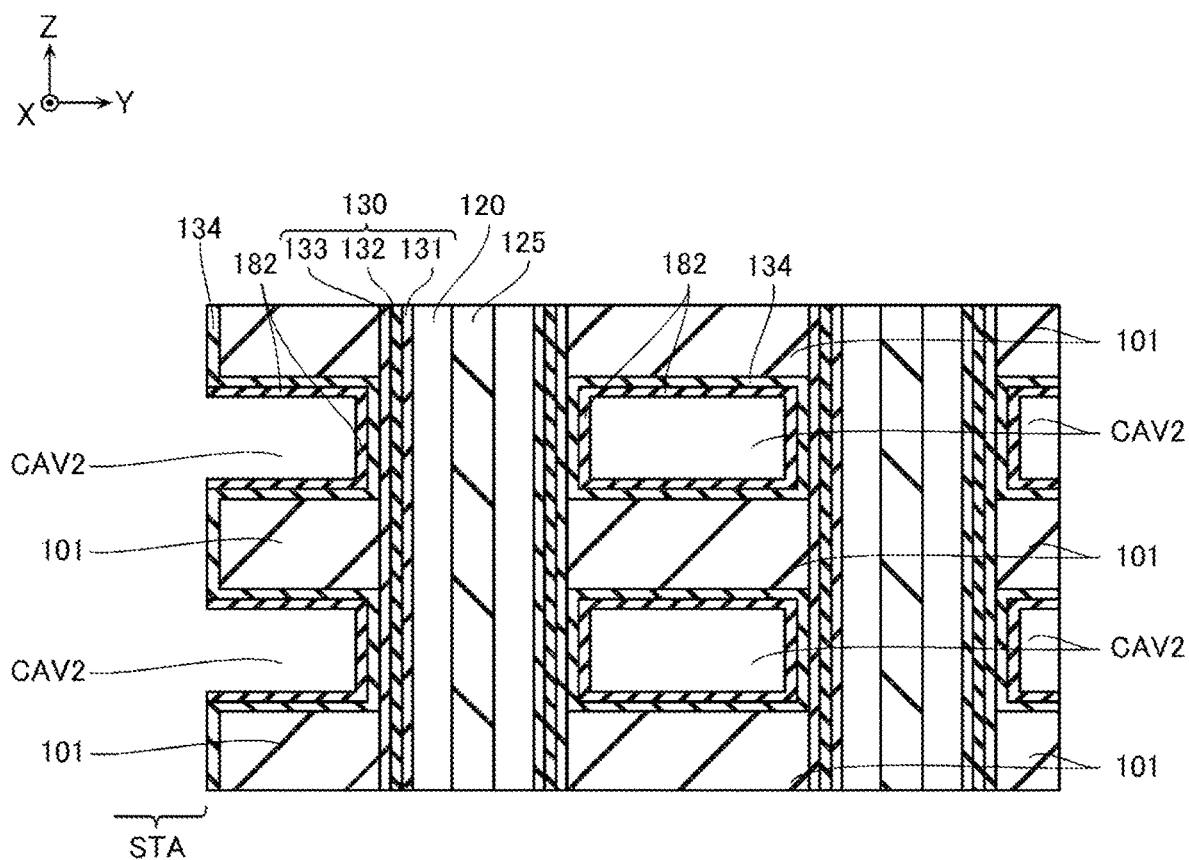
FIG. 16 is a schematic cross-sectional view illustrating a method for manufacturing the semiconductor storage device.

Next, as illustrated in FIG. 16, for example, the nitride film 182 is formed on the inner wall of the cavity CAV2 via the trench STA. This step is performed by, for example, a method such as CVD or the like. In this step, a nitride film similar to the nitride film 182 may be also formed on the inner wall of the trench STA, and these nitride films may be removed by, for example, RIE or the like.

Figure 17:
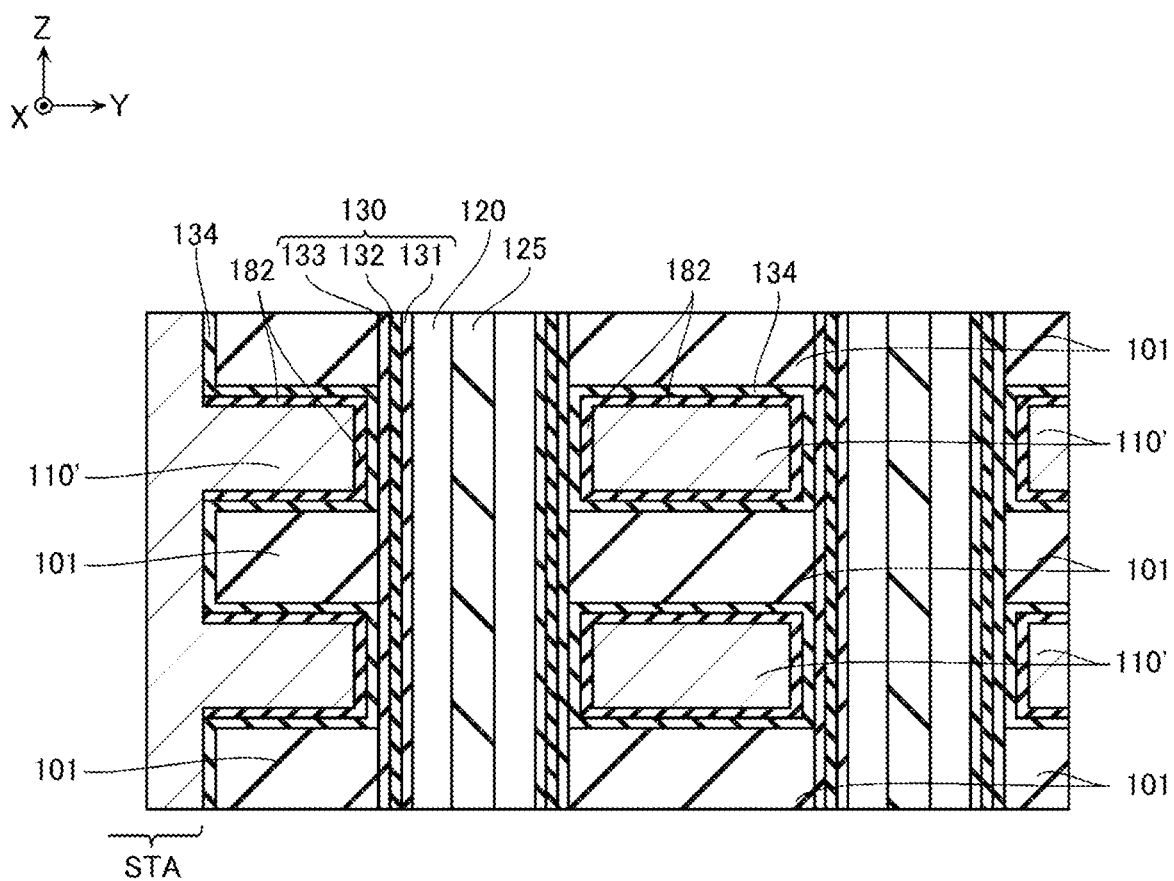
FIG. 17 is a schematic cross-sectional view illustrating a method for manufacturing the semiconductor storage device.

Next, as illustrated in FIG. 17, for example, a conductive layer 110' is formed in the cavity CAV2 via the trench STA. The conductive layer 110' contains, for example, the same material as that of the conductive layer 110. In this step, a part of the conductive layer 110' is also formed on the side surface of the trench STA in the Y direction. This step is performed by, for example, a method such as CVD or the like.

Figure 18:
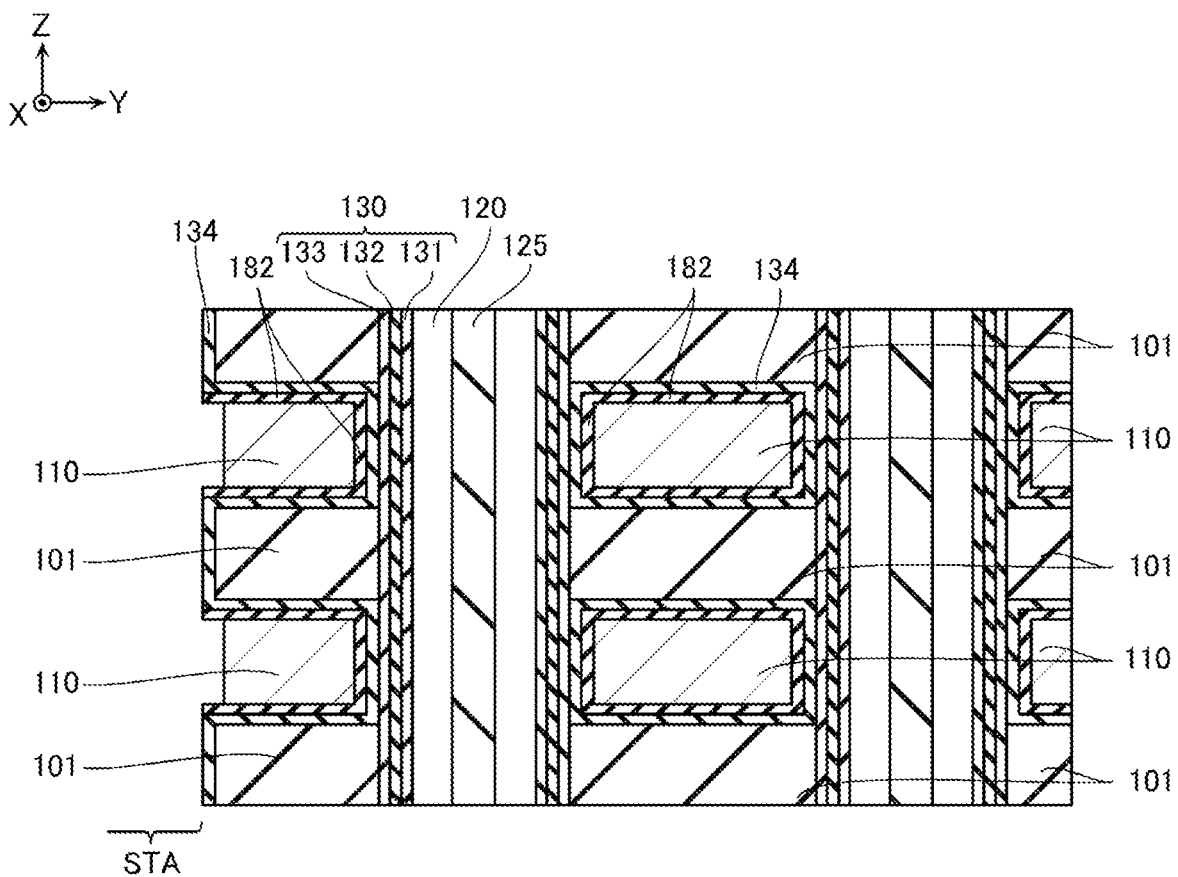
FIG. 18 is a schematic cross-sectional view illustrating a method for manufacturing the semiconductor storage device.

Next, for example, as illustrated in FIG. 18, a part of the conductive layer 110' is isotropically removed via the trench STA, thereby forming a plurality of conductive layers 110 separated in the Z direction. This step is performed by, for example, fluorine (F)-based dry etching, wet etching, or the like. This etching step is performed under etching conditions in which an etching rate is high for the conductive layer 110' and an etching rate is low for the insulating layer 134 and the nitride film 182.

Figure 19:
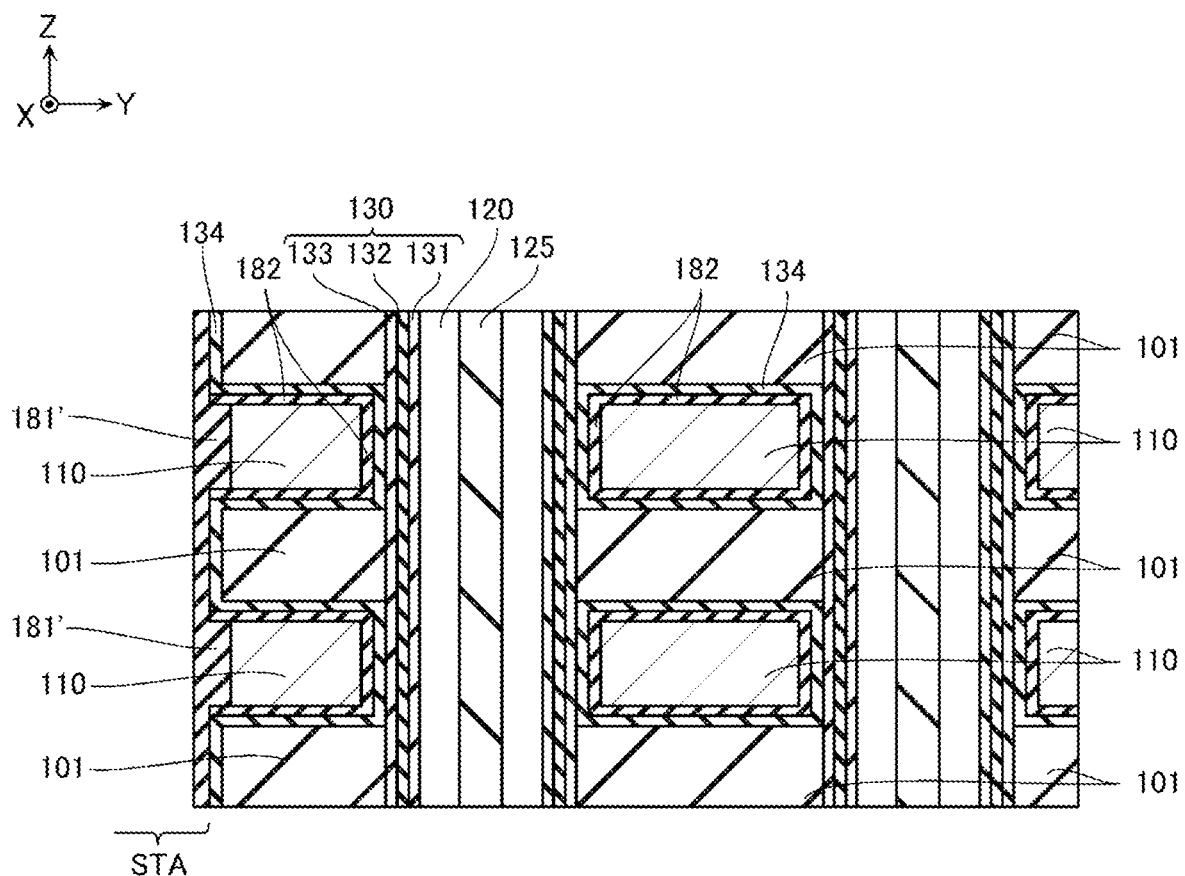
FIG. 19 is a schematic cross-sectional view illustrating a method for manufacturing the semiconductor storage device.

Next, for example, as illustrated in FIG. 19, a nitride film 181' provided continuously in the Z direction is formed on side surfaces of the plurality of insulating layers 101 and the plurality of conductive layers 110 in the Y direction via the trench STA. The nitride film 181' contains, for example, the same material as that of the nitride film 181 described with reference to FIG. 5. This step is performed by, for example, a method such as CVD or the like. Before the nitride film 181' is formed, a reduction treatment using hydrogen ($H_2$) gas may be performed on a side surface of the conductive layer 110 in the Y direction (an exposed surface with respect to the trench STA), or an oxide layer formed on the side surface of the conductive layer 110 in the Y direction may be removed by wet etching or the like.

Figure 20:
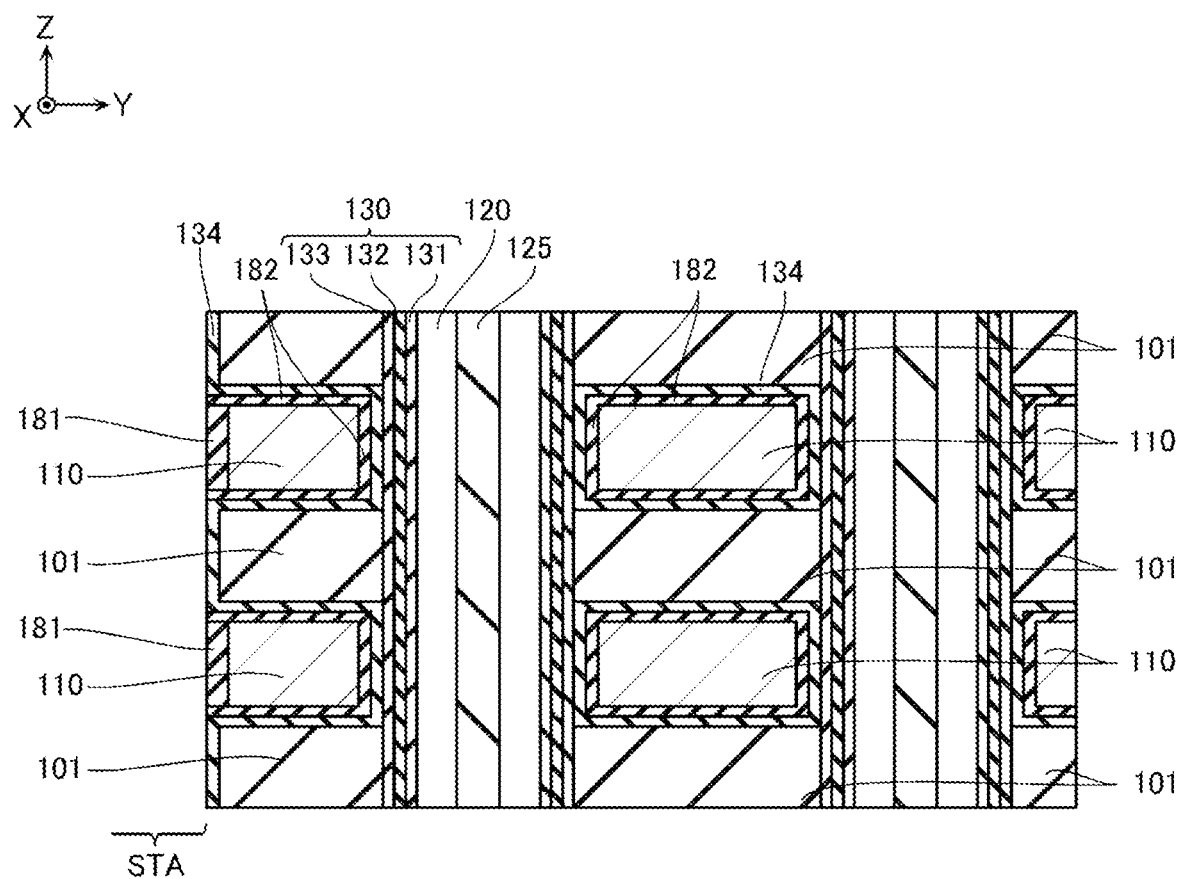
FIG. 20 is a schematic cross-sectional view illustrating a method for manufacturing the semiconductor storage device.

Next, for example, as illustrated in FIG. 20, a part of the nitride film 181' is isotropically removed via the trench STA, thereby forming a plurality of nitride films 181 separated in the Z direction. This step is performed by, for example, fluorine (F)-based dry etching, wet etching, or the like.

Next, the insulating layer 170 and the conductive layer LI are formed in the trench STA to form the block-to-block structure ST, and the contact Ch connected to the impurity region 121 and the string unit-to-string unit insulating layer SHE are formed, thereby forming the structure described with reference to FIG. 4.

Comparative Example

Figure 21:
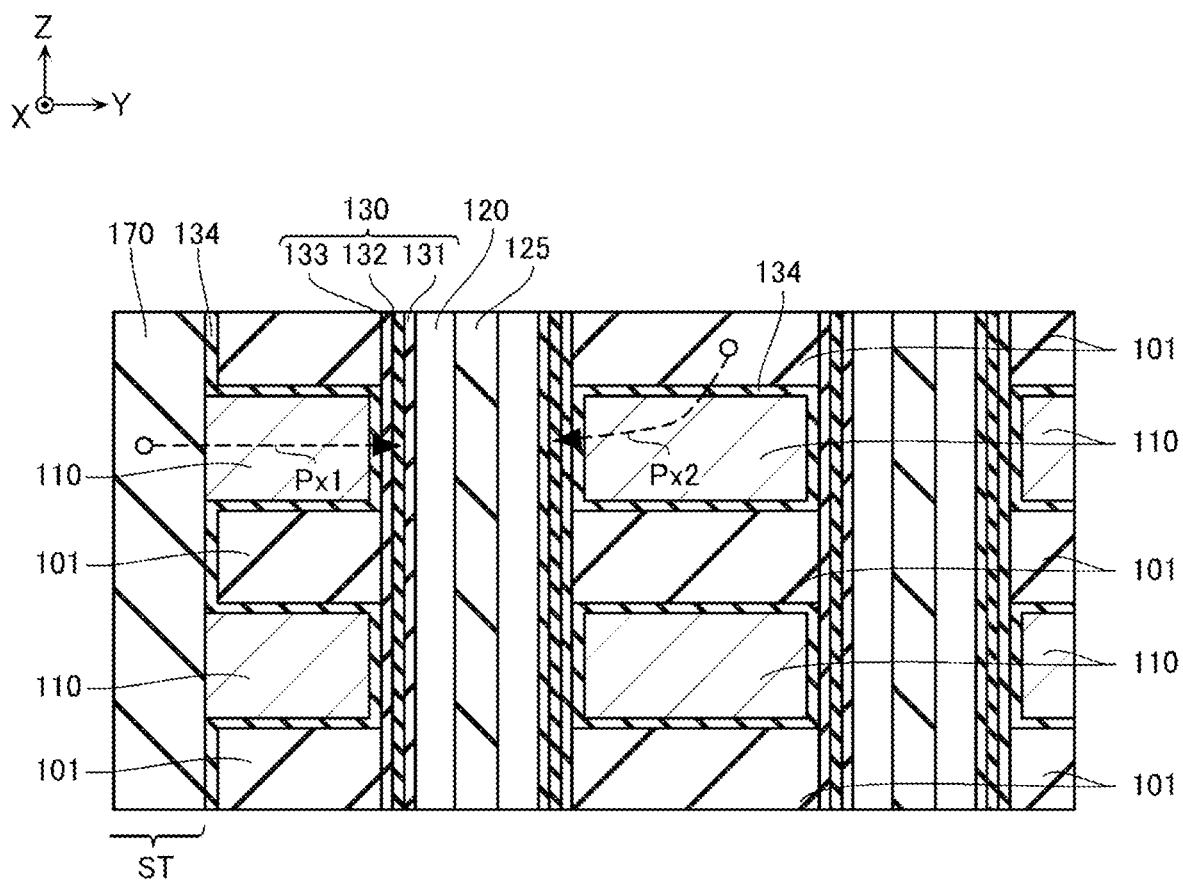
FIG. 21 is a schematic cross-sectional view illustrating a partial configuration of a semiconductor storage device according to a comparative example.

Next, a semiconductor storage device according to a comparative example will be described with reference to FIG. 21. FIG. 21 is a schematic cross-sectional view illustrating the semiconductor storage device according to the comparative example, and illustrates a cross section corresponding to that of FIG. 5.

The semiconductor storage device according to the comparative example is different from the semiconductor storage device (FIG. 5) according to the first embodiment in that the nitride film 181 is not provided on the surface of the conductive layer 110 facing the block-to-block structure ST, and the nitride film 182 is not provided on one side surface and the other side surface of the conductive layer 110 in the Z direction and on the surface facing the semiconductor layer 120 (FIG. 21).

In the manufacture of the semiconductor storage device according to the comparative example, the steps described with reference to FIGS. 19 and 20 are not executed.

In the manufacture of the above-described configuration, for example, in the step after the step illustrated in FIG. 18, impurities may enter the side surface of the conductive layer 110 exposed to the trench STA' in the Y direction. Examples of such impurities include hydrogen (H), oxygen (O), fluorine (F), chlorine (Cl), or the like. Such impurities may diffuse in the conductive layer 110 via a path shown by a dotted line Px1 (FIG. 21) and reach the block insulating film 133 and the charge storage film 132.

In the manufacture of the above-described configuration, for example, in the step after the step illustrated in FIG. 17, the above-described impurities may enter the conductive layer 110. Such impurities may diffuse in the insulating layer 101 and the conductive layer 110 via a path shown by a dotted line Px2 (FIG. 21) and reach the block insulating film 133 and the charge storage film 132.

In this manner, when a relatively large amount of the above-described impurities are mixed in the block insulating film 133 and the charge storage film 132, an undesirable impurity level is formed in the block insulating film 133 and the charge storage film 132, such that a data storage characteristic of the memory cell MC may deteriorate or a channel leak may occur.

Effect of First Embodiment

In the manufacture of the semiconductor storage device according to the first embodiment, the nitride film 181 is formed on the side surface of the conductive layer 110 in the Y direction in the steps described with reference to FIGS. 19 and 20. Here, in the nitride film 181, a diffusion coefficient of the above-described impurities is relatively small. Therefore, in the manufacture of the semiconductor storage device according to the first embodiment, in a step after the step described with reference to FIG. 20, it is possible to prevent the above-described impurities from entering the side surface of the conductive layer 110 in the Y direction.

In the manufacture of the semiconductor storage device according to the first embodiment, in the step described with reference to FIG. 16, the nitride film 182 is formed at the locations covering the upper and lower surfaces of the insulating layer 101 and the gate insulating layer 130. Here, in the nitride film 182, the diffusion coefficient of the above-described impurities is relatively small. Therefore, in the manufacture of the semiconductor storage device according to the first embodiment, in the step after the step described with reference to FIG. 17, it is possible to prevent the above-described impurities from entering the conductive layer 110.

Therefore, with the semiconductor storage device according to the first embodiment, it is possible to provide the memory cell MC that prevents the occurrence of channel leak and shows good data storage characteristic.

Modification of First Embodiment

Figure 22:
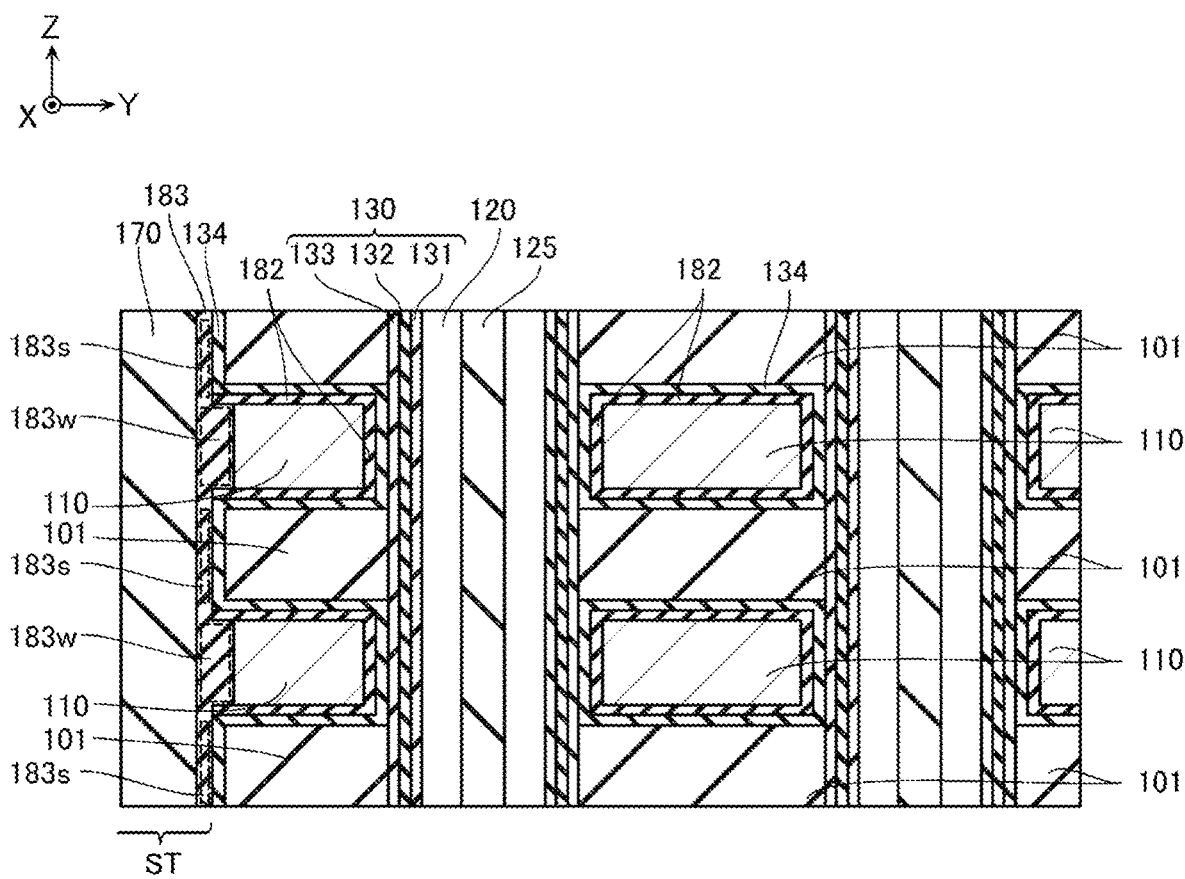
FIG. 22 is a schematic cross-sectional view illustrating a modification of the semiconductor storage device according to the first embodiment.

Next, a modification of the semiconductor storage device according to the first embodiment will be described with reference to FIG. 22. FIG. 22 is a schematic cross-sectional view illustrating a partial configuration of the semiconductor storage device according to the modification.

Nitride Film 183

For example, as illustrated in FIG. 22, the semiconductor storage device according to the modification of the first embodiment does not include the nitride film 181 (FIG. 5) of the first embodiment. However, in the semiconductor storage device according to the modification of the first embodiment, a nitride film 183 continuous in the Z direction is provided on side surfaces of a plurality of insulating layers 101 and a plurality of conductive layers 110 in the Y direction (surfaces facing the block-to-block structure ST). The nitride film 183 contains nitrogen (N).

The nitride film 183 includes a plurality of regions 183w corresponding to the plurality of conductive layers 110 and a plurality of regions 183s corresponding to the plurality of insulating layers 101. The region 183w covers a side surface of the conductive layer 110 in the Y direction (a surface facing the block-to-block structure ST). The region 183s covers a side surface of the insulating layer 101 in the Y direction (a surface of the insulating layer 101 facing the block-to-block structure ST).

The nitride film 183 is a film showing insulating properties or a film showing high resistance and conductivity. The nitride film 183 contains, for example, at least one of molybdenum (Mo), ruthenium (Ru), tungsten (W), silicon (Si), and aluminum (Al). The nitride film 183 may be, for example, molybdenum nitride (MoN), ruthenium nitride (RuN), tungsten nitride (WN), silicon nitride (SiN), aluminum nitride (AlN), or the like. For example, molybdenum nitride (MoN), ruthenium nitride (RuN), and tungsten nitride (WN) are generally films showing high resistance and conductivity.

Manufacturing Method

The semiconductor storage device according to the modification of the first embodiment is basically manufactured in the same manner as that of the semiconductor storage device according to the first embodiment. However, a method for manufacturing the semiconductor storage device according to the modification does not perform a step corresponding to the step described with reference to FIG. 20, that is, the step of isotropically removing a part of the nitride film 181' to form the plurality of nitride films 181 separated in the Z direction. The method for manufacturing the semiconductor storage device according to the modification causes the nitride film to remain on the side surface of the insulating layer 101 in the Y direction, thereby forming the nitride film 183 continuously provided in the Z direction.

Second Embodiment

Figure 23:
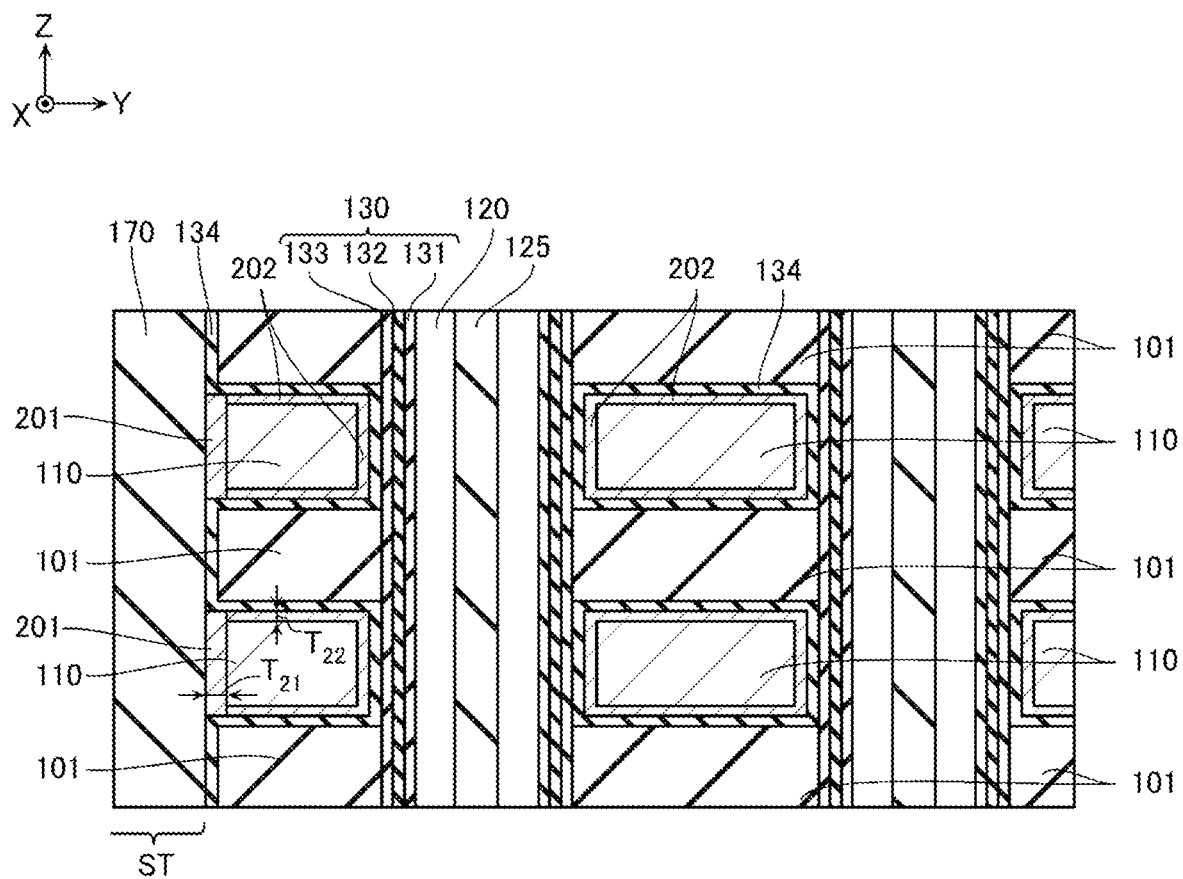
FIG. 23 is a schematic cross-sectional view illustrating a partial configuration of a semiconductor storage device according to a second embodiment.

Next, a semiconductor storage device according to a second embodiment will be described with reference to FIG. 23. FIG. 23 is a schematic cross-sectional view illustrating the semiconductor storage device according to the second embodiment.

Nitride Film 201

The semiconductor storage device according to the second embodiment is basically configured in the same manner as that of the semiconductor storage device according to the first embodiment. However, as illustrated in FIG. 23, the semiconductor storage device according to the second embodiment includes a nitride film 201 containing nitrogen (N) instead of the nitride film 181 (FIG. 5) on a side surface of the conductive layer 110 in the Y direction (a surface facing the block-to-block structure ST).

The nitride film 201 is a film showing conductivity. The nitride film 201 contains, for example, titanium (Ti) or the like. For example, the nitride film 201 may be titanium nitride (TiN) or the like.

As illustrated in FIG. 23, the semiconductor storage device according to the second embodiment includes a nitride film 202 containing nitrogen (N) on one side surface and the other side surface of the conductive layer 110 in the Z direction, and on a surface facing the semiconductor layer 120.

The nitride film 202 is a film showing conductivity. The nitride film 202 contains, for example, titanium (Ti) or the like. For example, the nitride film 202 may be titanium nitride (TiN) or the like.

The nitride film 201 and the nitride film 202 may contain titanium (Ti) or the like in common.

A film thickness $T_{21}$ of the nitride film 201 may be larger than a film thickness $T_{22}$ of the nitride film 202.

The film thickness $T_{21}$ of the nitride film 201 may be smaller than the film thickness $T_{22}$ of the nitride film 202.

Manufacturing Method

Next, a method for manufacturing the semiconductor storage device according to the second embodiment will be described with reference to FIGS. 24 to 28. FIGS. 24 to 28 are schematic cross-sectional views illustrating the manufacturing method, and illustrate a cross section corresponding to that of FIG. 23.

Figure 24:
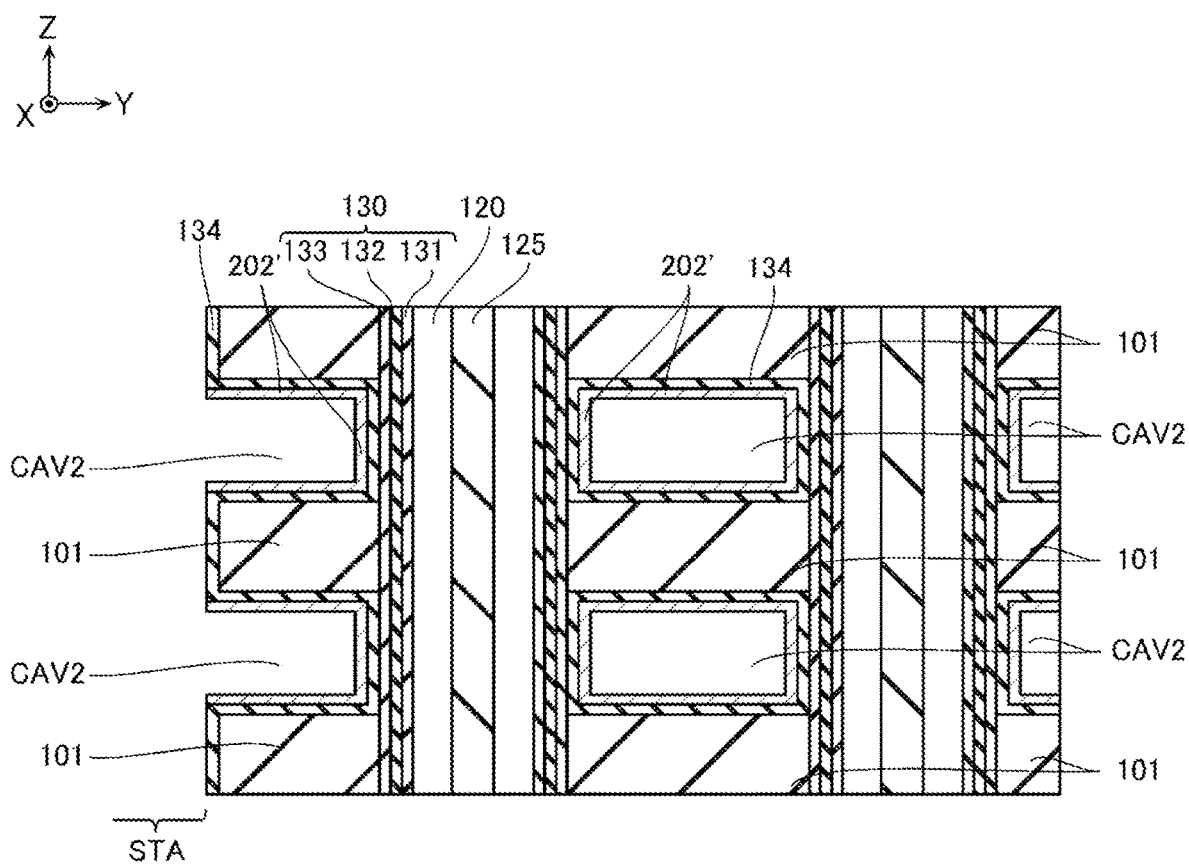
FIG. 24 is a schematic cross-sectional view illustrating a method for manufacturing the semiconductor storage device.

The semiconductor storage device according to the second embodiment is basically manufactured in the same manner as that of the semiconductor storage device according to the first embodiment. However, as illustrated in FIG. 24, a method for manufacturing the semiconductor storage device according to the second embodiment forms a nitride film 202' instead of the nitride film 182 in a step corresponding to that of FIG. 16. The nitride film 202' contains the same material as that of the nitride film 202. This step is performed by, for example, a method such as CVD or the like. In this step, the same nitride film as the nitride film 202' may be formed on the inner wall of the trench STA, and these nitride films may be removed by, for example, RIE or the like.

Figure 25:
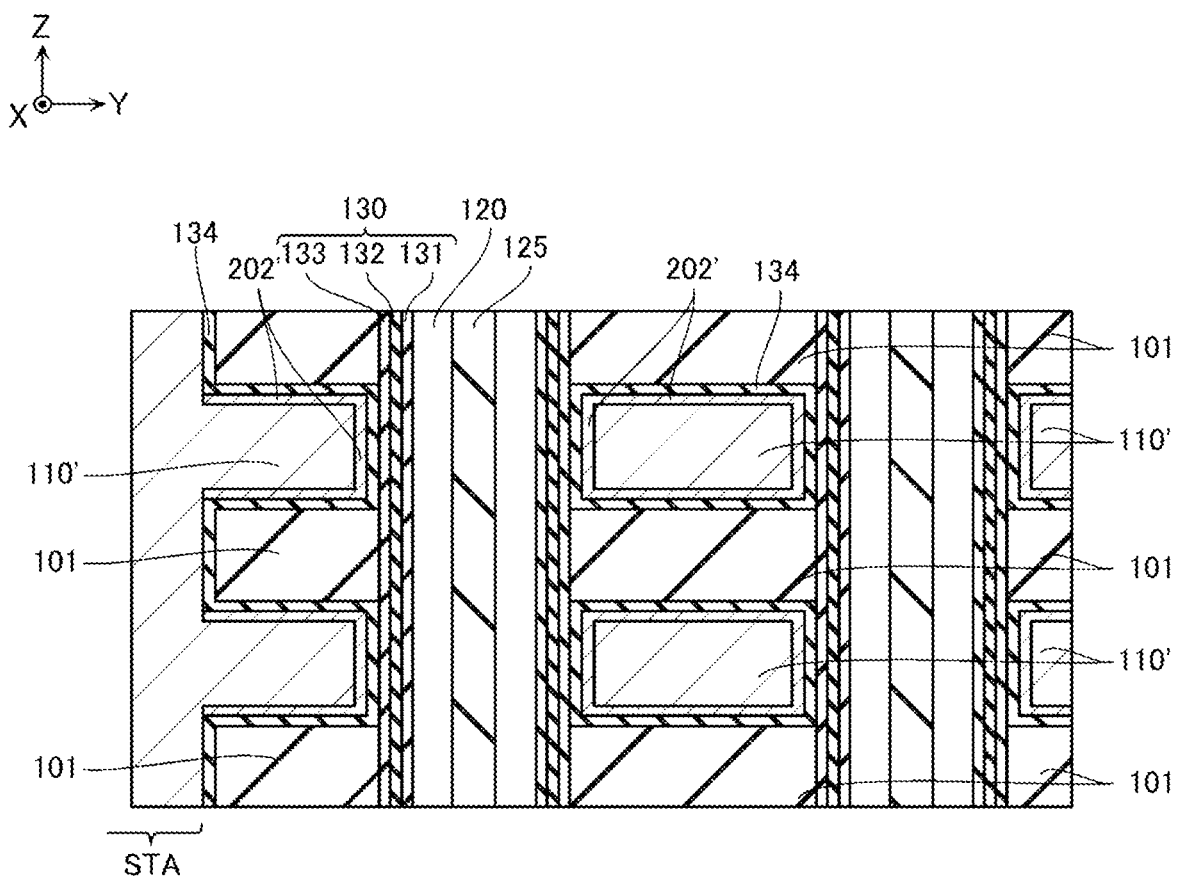
FIG. 25 is a schematic cross-sectional view illustrating a method for manufacturing the semiconductor storage device.

Next, as illustrated in FIG. 25, for example, the conductive layer 110' is formed in the cavity CAV2 via the trench STA. This step is performed by, for example, a method such as CVD or the like.

Figure 26:
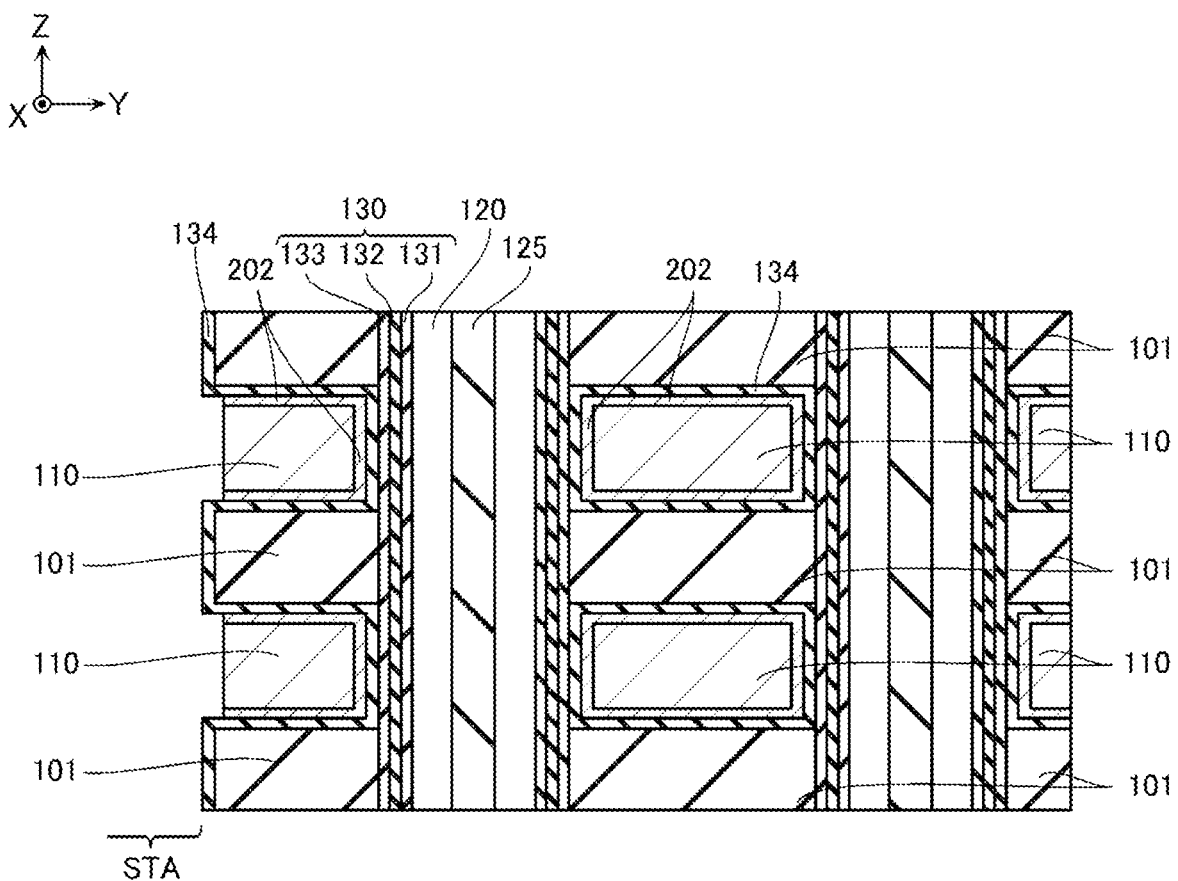
FIG. 26 is a schematic cross-sectional view illustrating a method for manufacturing the semiconductor storage device.

Next, for example, as illustrated in FIG. 26, a part of the conductive layer 110' and the nitride film 202' is isotropically removed via the trench STA to form a plurality of conductive layers 110 separated in the Z direction and a plurality of nitride films 202 separated in the Z direction. This step is performed by, for example, fluorine (F)-based dry etching, wet etching, or the like. This etching step is performed under etching conditions in which an etching rate is high for the conductive layer 110' and the nitride film 202', and an etching rate is low for the insulating layer 134.

Figure 27:
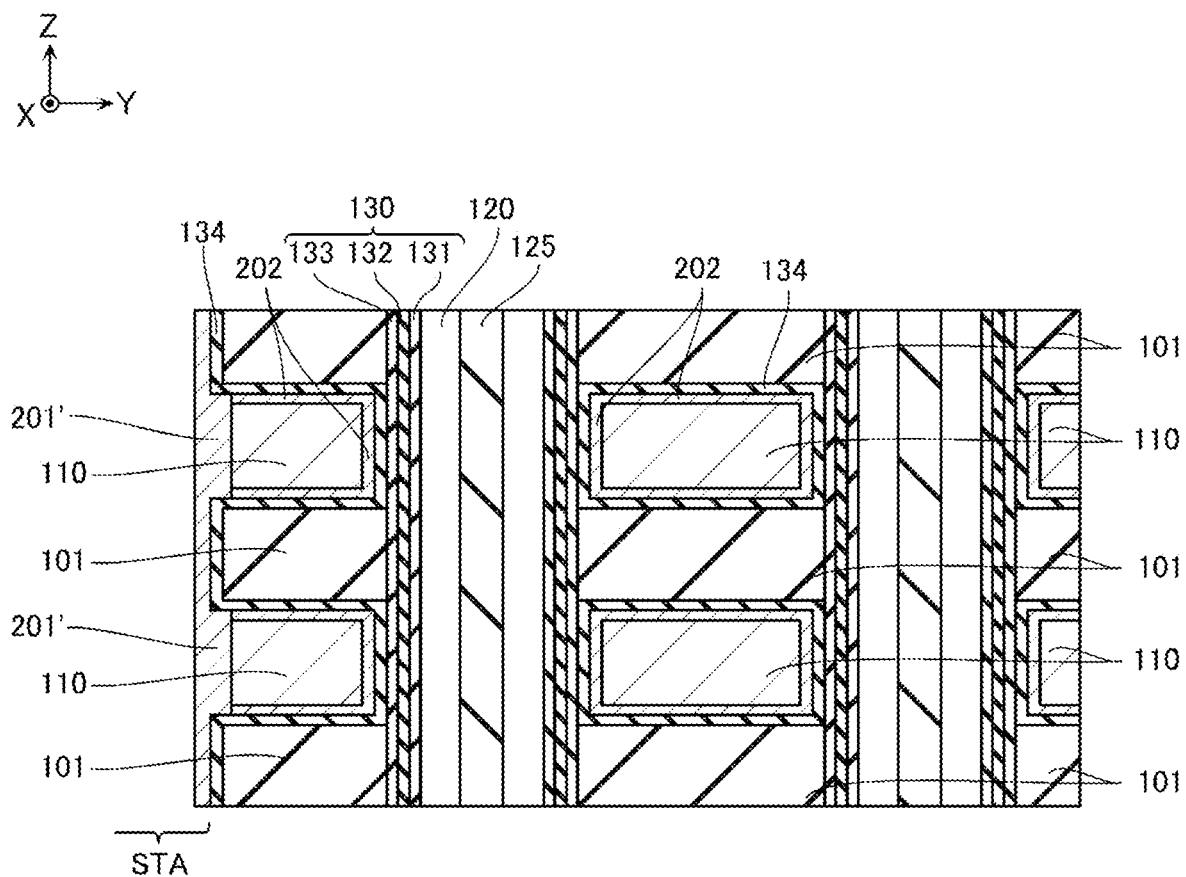
FIG. 27 is a schematic cross-sectional view illustrating a method for manufacturing the semiconductor storage device.

Next, as illustrated in FIG. 27, for example, a nitride film 201' continuously provided in the Z direction is formed on side surfaces of the plurality of insulating layers 101 and the plurality of conductive layers 110 in the Y direction via the trench STA. The nitride film 201' contains, for example, the same material as that of the nitride film 201 described with reference to FIG. 23. This step is performed by, for example, a method such as CVD or the like. Before the nitride film 201' is formed, the reduction treatment or the like described with reference to FIG. 19 may be performed on the side surface of the conductive layer 110 in the Y direction.

Figure 28:
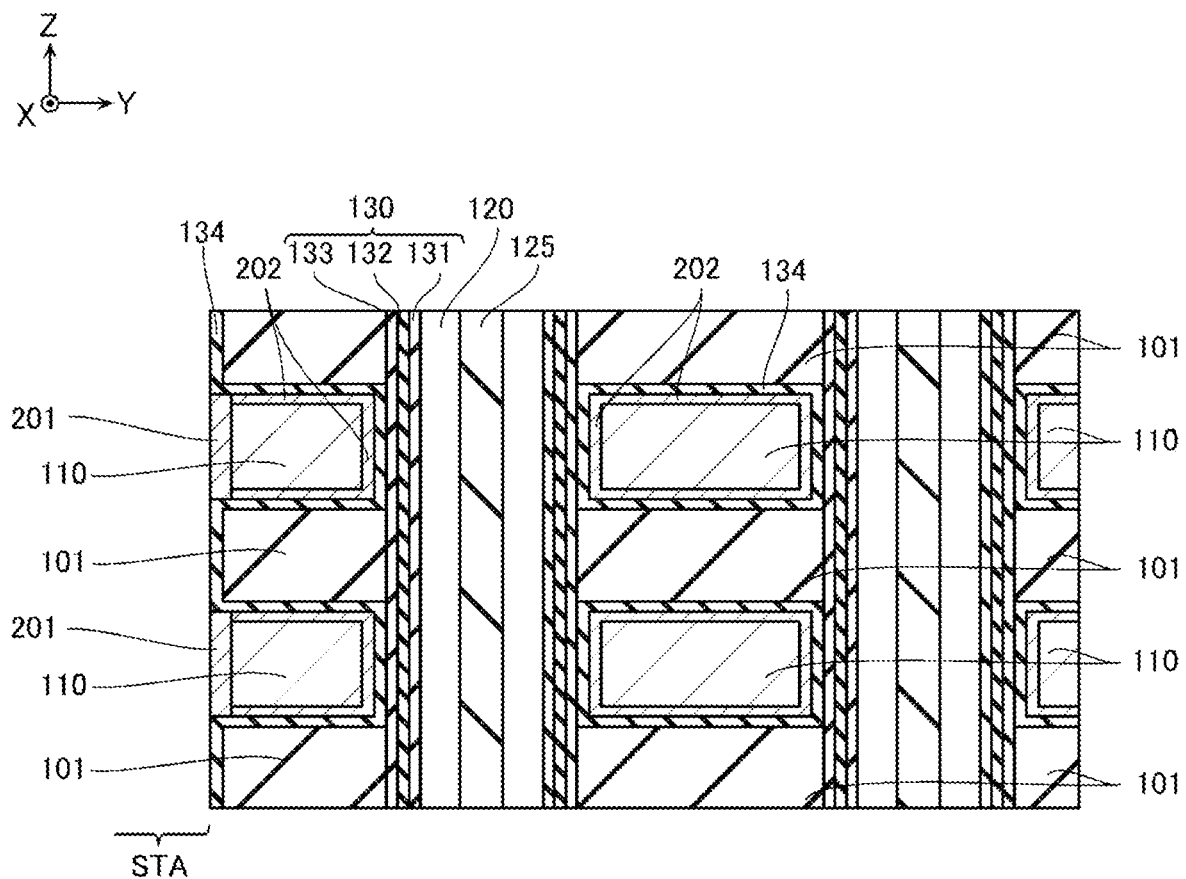
FIG. 28 is a schematic cross-sectional view illustrating a method for manufacturing the semiconductor storage device.

Next, for example, as illustrated in FIG. 28, a part of the nitride film 201' is isotropically removed via the trench STA to form a plurality of nitride films 201 separated in the Z direction. This step is performed by, for example, fluorine (F)-based dry etching, wet etching, or the like.

Effect of Second Embodiment

With the semiconductor storage device according to the second embodiment, in the same manner as that of the semiconductor storage device according to the first embodiment, it is possible to provide a memory cell MC that prevents the occurrence of channel leak and shows good data storage characteristic.

In the embodiment, the nitride film 202 showing conductivity is provided on the upper and lower surfaces of the conductive layer 110. According to such a configuration, the nitride film 202 can function as a part of the word line WL, and the substantial resistance of the word line WL can be reduced. Therefore, it is possible to provide a memory cell MC having a good characteristic.

Modification of Second Embodiment

Figure 29:
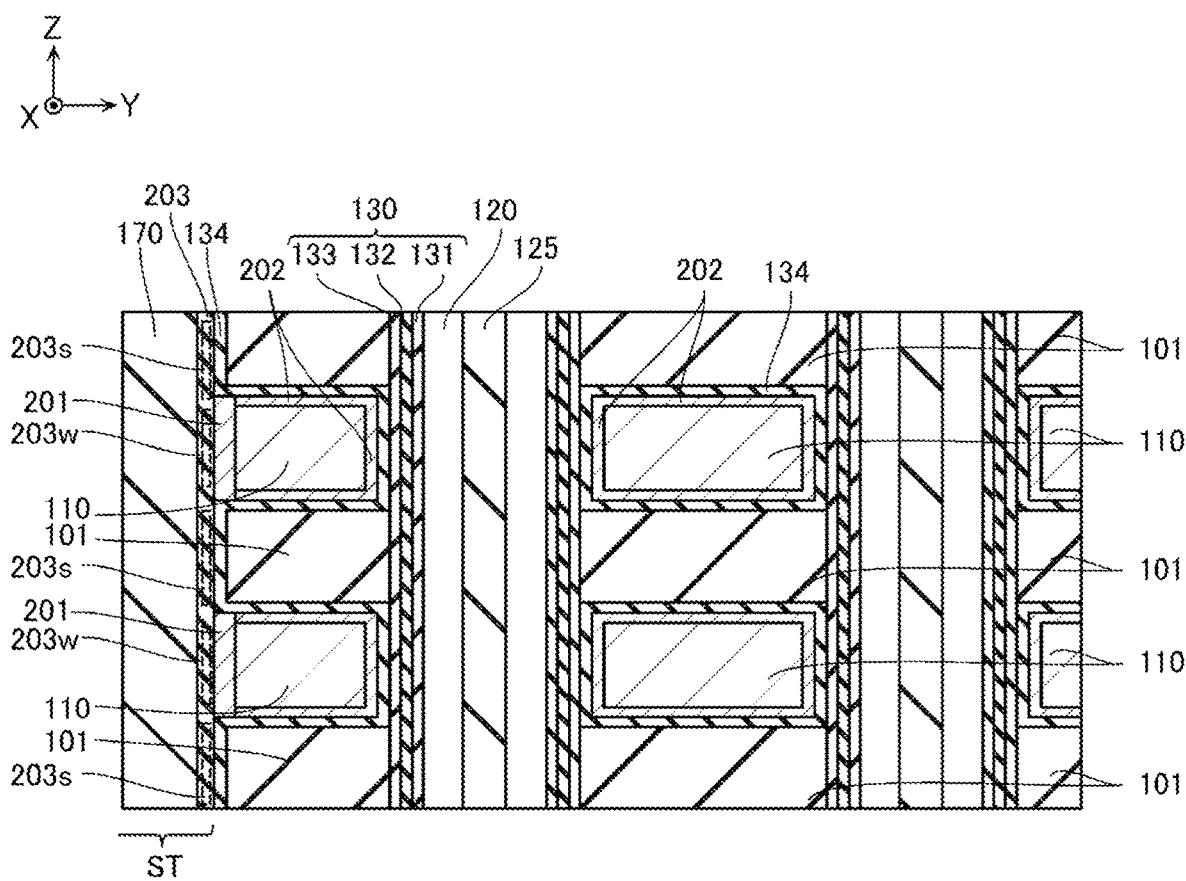
FIG. 29 is a schematic cross-sectional view illustrating a modification of the semiconductor storage device.

Next, a modification of the semiconductor storage device according to the second embodiment will be described with reference to FIG. 29. FIG. 29 is a schematic cross-sectional view illustrating a partial configuration of the semiconductor storage device according to the modification.

Nitride Film 203

For example, as illustrated in FIG. 29, the semiconductor storage device according to the modification of the second embodiment includes a nitride film 203 that covers side surfaces of a plurality of insulating layers 101 and a plurality of conductive layers 110 in the Y direction (surfaces facing the block-to-block structure ST). The nitride film 203 is continuously provided in the Z direction. The nitride film 203 contains nitrogen (N).

The nitride film 203 includes a plurality of regions 203w corresponding to the plurality of conductive layers 110 and a plurality of regions 203s corresponding to the plurality of insulating layers 101. The region 203w covers a side surface of the conductive layer 110 in the Y direction (a surface facing the block-to-block structure ST) via the nitride film 201. The region 203s covers a side surface of the insulating layer 101 in the Y direction (a surface facing the block-to-block structure ST).

The nitride film 203 is a film showing insulating properties or a film showing high resistance and conductivity. The nitride film 203 contains, for example, at least one of molybdenum (Mo), ruthenium (Ru), tungsten (W), silicon (Si), and aluminum (Al). The nitride film 203 may be, for example, molybdenum nitride (MoN), ruthenium nitride (RuN), tungsten nitride (WN), silicon nitride (SiN), aluminum nitride (AlN), or the like. For example, molybdenum nitride (MoN), ruthenium nitride (RuN), and tungsten nitride (WN) are generally films showing high resistance and conductivity.

Manufacturing Method

The semiconductor storage device according to the modification of the second embodiment is basically manufactured in the same manner as that of the semiconductor storage device according to the second embodiment. However, a method for manufacturing the semiconductor storage device according to the modification performs a step of forming, by CVD or the like, the nitride film 203 on the side surfaces of the plurality of insulating layers 101 and the plurality of nitride films 201 in the Y direction via the trench STA after the step corresponding to that of FIG. 28, that is, the step of forming the plurality of nitride films 201 separated in the Z direction.

Third Embodiment

Next, a semiconductor storage device according to a third embodiment will be described with reference to FIG. 30.

Figure 30:
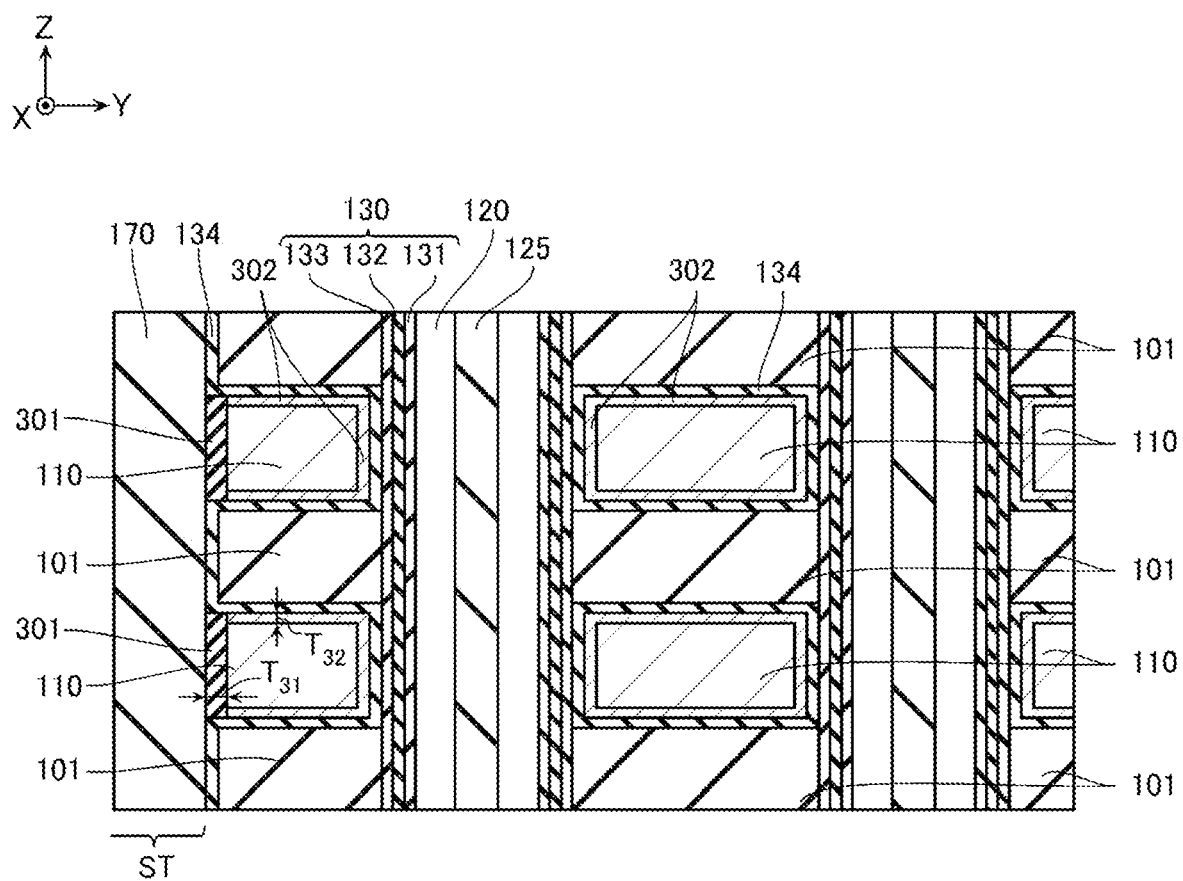
FIG. 30 is a schematic cross-sectional view illustrating a partial configuration of a semiconductor storage device according to a third embodiment.

FIG. 30 is a schematic cross-sectional view illustrating the semiconductor storage device according to the third embodiment.

Nitride Film 301

The semiconductor storage device according to the third embodiment is basically configured in the same manner as that of the semiconductor storage device according to the second embodiment. However, as illustrated in FIG. 30, the semiconductor storage device according to the third embodiment includes a nitride film 301 containing nitrogen (N) instead of the nitride film 201 (FIG. 23) on a side surface of the conductive layer 110 in the Y direction (a surface facing the block-to-block structure ST).

The nitride film 301 is a film showing insulating properties or a film showing high resistance and conductivity. The nitride film 301 contains, for example, at least one of molybdenum (Mo), ruthenium (Ru), tungsten (W), silicon (Si), and aluminum (Al). For example, the nitride film 301 may be molybdenum nitride (MoN), ruthenium nitride (RuN), tungsten nitride (WN), silicon nitride (SiN), aluminum nitride (AlN), or the like. For example, molybdenum nitride (MoN), ruthenium nitride (RuN), and tungsten nitride (WN) are generally films showing high resistance and conductivity.

The plurality of conductive layers 110 and nitride films 301 may contain at least one of molybdenum (Mo), tungsten (W), and ruthenium (Ru) in common. For example, when the conductive layer 110 contains molybdenum (Mo), the nitride film 301 may contain molybdenum nitride (MoN). For example, when the conductive layer 110 contains tungsten (W), the nitride film 301 may contain tungsten nitride (WN). For example, when the conductive layer 110 contains ruthenium (Ru), the nitride film 301 may contain ruthenium nitride (RuN).

As illustrated in FIG. 30, a nitride film 302 containing nitrogen (N) is provided on upper and lower surfaces of the conductive layer 110 and a surface facing the semiconductor layer 120.

The nitride film 302 is a film showing conductivity. The nitride film 302 contains, for example, titanium (Ti) or the like. The nitride film 302 may be, for example, titanium nitride (TiN) or the like.

A film thickness $T_{31}$ of the nitride film 301 may be larger than a film thickness $T_{32}$ of the nitride film 302.

The film thickness $T_{31}$ of the nitride film 301 may be smaller than the film thickness $T_{32}$ of the nitride film 302.

Manufacturing Method

The semiconductor storage device according to the third embodiment is basically manufactured in the same manner as that of the semiconductor storage device according to the second embodiment. However, a method for manufacturing the semiconductor storage device according to the third embodiment forms the nitride film 301 instead of the nitride film 201 in steps corresponding to those of FIGS. 27 and 28.

Modification of Third Embodiment

Figure 31:
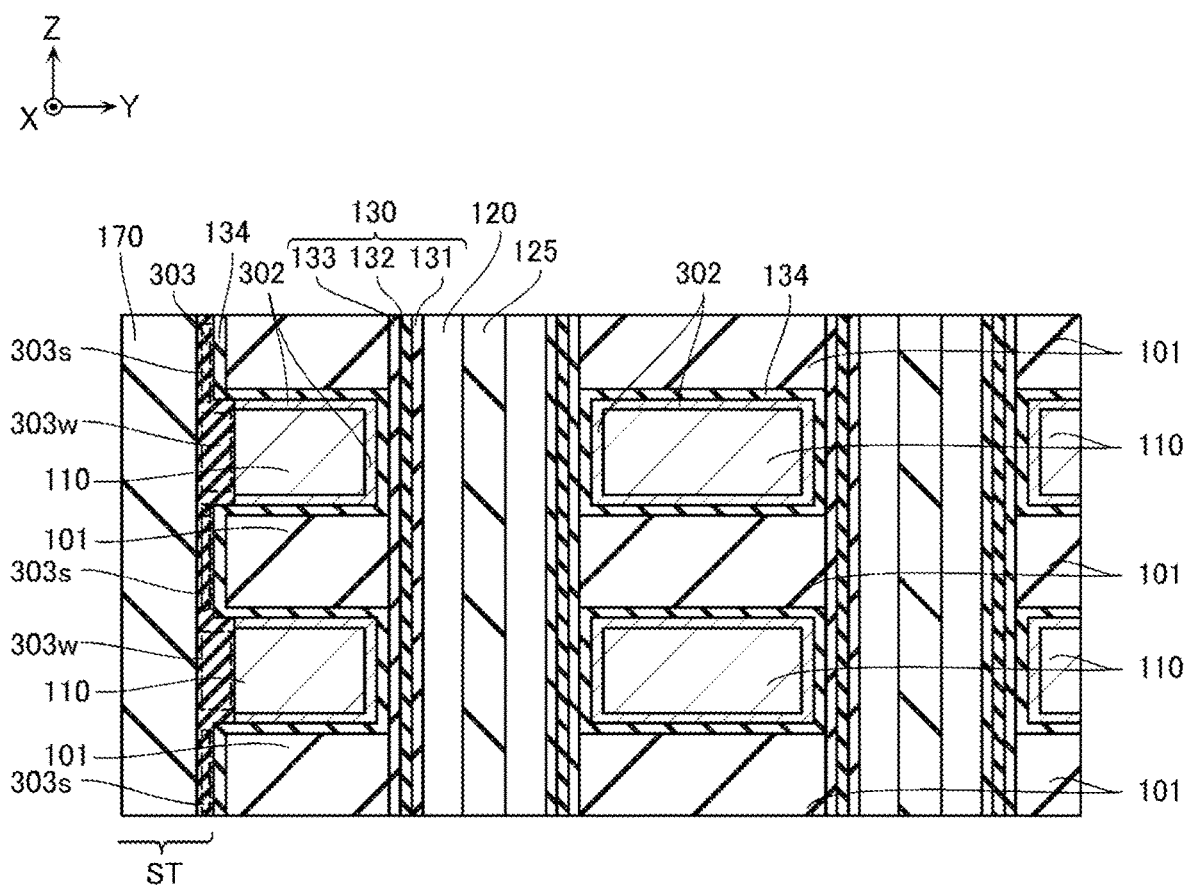
FIG. 31 is a schematic cross-sectional view illustrating a modification of the semiconductor storage device.

Next, a modification of the semiconductor storage device according to the third embodiment will be described with reference to FIG. 31. FIG. 31 is a schematic cross-sectional view illustrating a partial configuration of the semiconductor storage device according to the modification.

Nitride Film 303

For example, as illustrated in FIG. 31, the semiconductor storage device according to the modification of the third embodiment does not include the nitride film 301. The semiconductor storage device according to the modification of the third embodiment includes a nitride film 303 provided on side surfaces of a plurality of insulating layers 101 and a plurality of conductive layers 110 in the Y direction (surfaces facing the block-to-block structure ST). The nitride film 303 is continuously provided in the Z direction. The nitride film 303 contains nitrogen (N).

The nitride film 303 includes a plurality of regions $303w$ corresponding to the plurality of conductive layers 110 and a plurality of regions $303s$ corresponding to the plurality of insulating layers 101. The region $303w$ covers a side surface of the conductive layer 110 in the Y direction (a surface facing the block-to-block structure ST). The region $303s$ covers a side surface of the insulating layer 101 in the Y direction (a surface facing the block-to-block structure ST).

The nitride film 303 is a film showing insulating properties or a film showing high resistance and conductivity. The nitride film 303 contains, for example, at least one of molybdenum (Mo), ruthenium (Ru), tungsten (W), silicon (Si), and aluminum (Al). The nitride film 303 may be, for example, molybdenum nitride (MoN), ruthenium nitride (RuN), tungsten nitride (WN), silicon nitride (SiN), aluminum nitride (AlN), or the like. For example, molybdenum nitride (MoN), ruthenium nitride (RuN), and tungsten nitride (WN) are generally films showing high resistance and conductivity.

Manufacturing Method

The semiconductor storage device according to the modification of the third embodiment is basically manufactured in the same manner as that of the semiconductor storage device according to the second embodiment. However, a method for manufacturing the semiconductor storage device according to the modification forms the nitride film 303 instead of the nitride film 201' in a step corresponding to that of FIG. 27. The method therefor does not perform the step described with reference to FIG. 28, that is, the step of isotropically removing a part of the nitride film to form a plurality of nitride films 201 separated in the Z direction.

Fourth Embodiment

Figure 32:
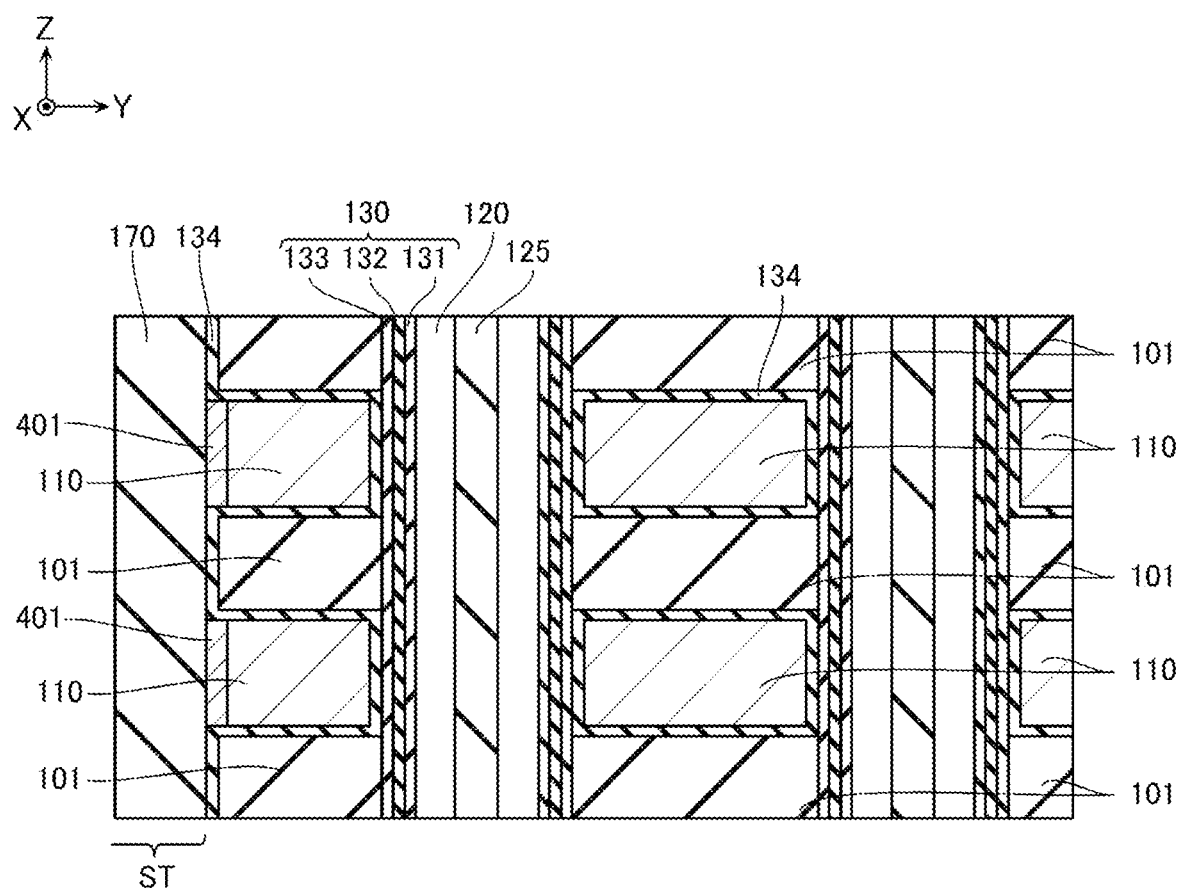
FIG. 32 is a schematic cross-sectional view illustrating a partial configuration of a semiconductor storage device according to a fourth embodiment.

Next, a semiconductor storage device according to a fourth embodiment will be described with reference to FIG. 32. FIG. 32 is a schematic cross-sectional view illustrating the semiconductor storage device according to the fourth embodiment.

The semiconductor storage device according to the fourth embodiment is basically configured in the same manner as those of the semiconductor storage devices according to the first to third embodiments. However, the semiconductor storage device according to the fourth embodiment is different from the semiconductor storage devices according to the first to third embodiments in that the nitride film containing nitrogen (N) is not provided on the upper and lower surfaces of the conductive layer 110 and on the surface facing the semiconductor layer 120. As illustrated in FIG. 32, the semiconductor storage device according to the fourth embodiment includes a nitride film 401 containing nitrogen (N) on a side surface of the conductive layer 110 in the Y direction (a surface facing the block-to-block structure ST).

The nitride film 401 is a film showing conductivity. The nitride film 401 contains, for example, titanium (Ti) or the like. The nitride film 401 may be, for example, titanium nitride (TiN) or the like.

Manufacturing Method

The semiconductor storage device according to the fourth embodiment is basically manufactured in the same manner as that of the semiconductor storage device according to the second embodiment. However, a method for manufacturing the semiconductor storage device according to the fourth embodiment does not form the nitride film 202' in a step corresponding to that of FIG. 24. The method for manufacturing the semiconductor storage device according to the fourth embodiment forms the nitride film 401 instead of the nitride film 201 in steps corresponding to those of FIGS. 27 and 28.

Modification of Fourth Embodiment

Figure 33:
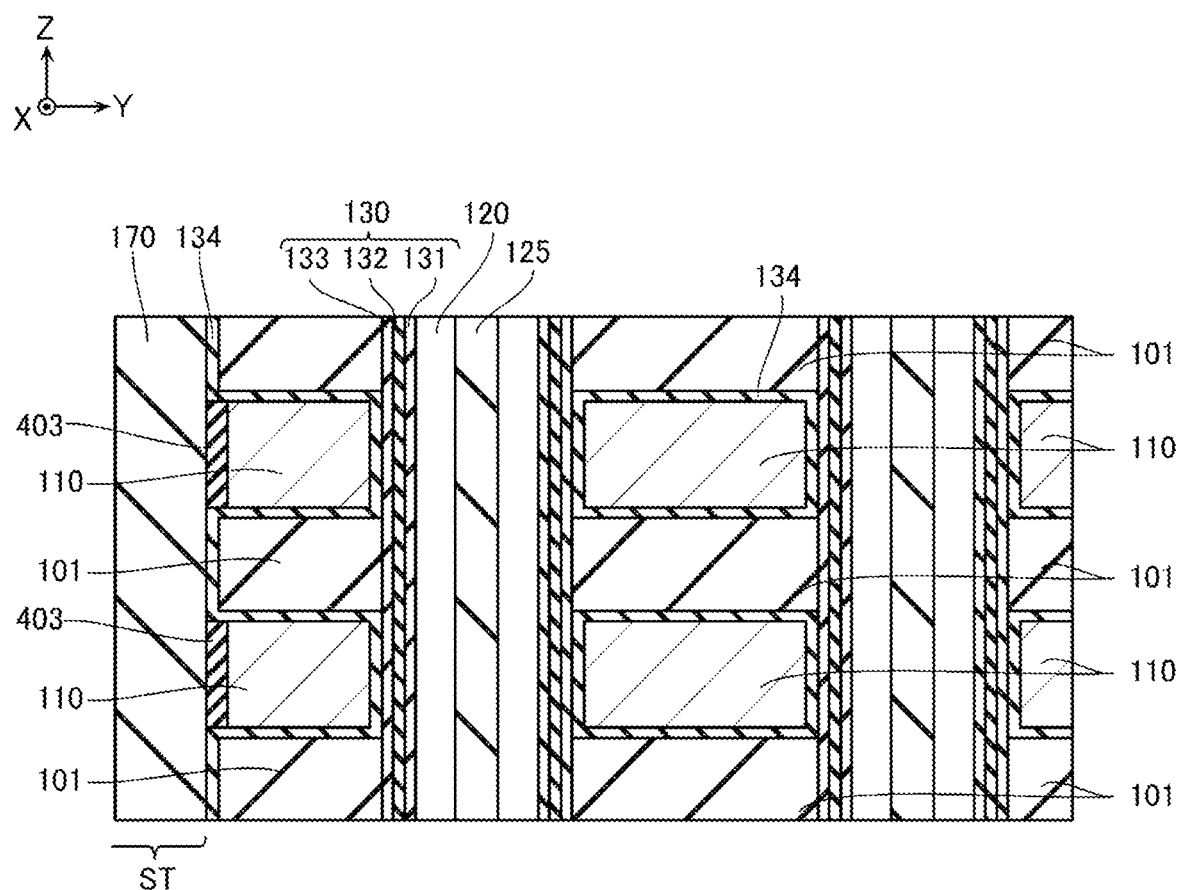
FIG. 33 is a schematic cross-sectional view illustrating a modification of the semiconductor storage device.

Next, a modification of the semiconductor storage device according to the fourth embodiment will be described with reference to FIG. 33. FIG. 33 is a schematic cross-sectional view illustrating a partial configuration of the semiconductor storage device according to the modification.

For example, as illustrated in FIG. 33, the semiconductor storage device according to the modification of the fourth embodiment does not include the nitride film 401, but instead includes a nitride film 403.

The nitride film 403 is a film showing insulating properties or a film showing high resistance and conductivity. The nitride film 403 contains, for example, at least one of molybdenum (Mo), ruthenium (Ru), tungsten (W), silicon (Si), and aluminum (Al). The nitride film 403 may be, for example, molybdenum nitride (MoN), ruthenium nitride (RuN), tungsten nitride (WN), silicon nitride (SiN), aluminum nitride (AlN), or the like. For example, molybdenum nitride (MoN), ruthenium nitride (RuN), and tungsten nitride (WN) are generally films showing high resistance and conductivity.

The plurality of conductive layers 110 and nitride films 403 may contain at least one of molybdenum (Mo), tungsten (W), and ruthenium (Ru) in common. For example, when the conductive layer 110 contains molybdenum (Mo), the nitride film 403 may contain molybdenum nitride (MoN). For example, when the conductive layer 110 contains tungsten (W), the nitride film 403 may contain tungsten nitride (WN). For example, when the conductive layer 110 contains ruthenium (Ru), the nitride film 403 may contain ruthenium nitride (RuN).

Others

The methods for manufacturing the semiconductor storage devices according to the first embodiment and the third embodiment form, for example, the nitride film 181 (FIG. 5) and the nitride film 301 (FIG. 30) on the side surface of the conductive layer 110 in the Y direction, in the step illustrated in FIG. 19 or the step corresponding thereto. However, the nitride film 181 and the nitride film 301 may be formed by another manufacturing step. For example, after the step illustrated in FIG. 18 or the like, the nitride film 181 and the nitride film 301 may be formed by thermally nitriding the side surface of the conductive layer 110 in the Y direction (the surface exposed to the trench STA) with a high temperature nitrogen atmosphere.

In this manner, when the nitride film 181 and the nitride film 301 are formed by thermal nitriding, and for example, when the conductive layer 110 contains molybdenum (Mo), the nitride film 181 and the nitride film 301 may contain molybdenum nitride (MoN). For example, when the conductive layer 110 contains tungsten (W), the nitride film 181 and the nitride film 301 may contain tungsten nitride (WN). For example, when the conductive layer 110 contains ruthenium (Ru), the nitride film 181 and the nitride film 301 may contain ruthenium nitride (RuN).

When the nitride film 181 is formed by thermal nitriding, the film thickness $T_{11}$ of the nitride film 181 may be smaller than the film thickness $T_{12}$ of the nitride film 182. When the nitride film 301 is formed by thermal nitriding, the film thickness $T_{31}$ of the nitride film 301 may be smaller than the film thickness $T_{32}$ of the nitride film 302.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
   a plurality of conductive layers arranged in a first direction;
   a semiconductor layer extending in the first direction, and facing the plurality of conductive layers;
   a charge storage layer disposed between the plurality of conductive layers and the semiconductor layer;
   a first structure (i) disposed apart from the semiconductor layer in a second direction intersecting the first direction, (ii) extending in a third direction intersecting the first direction and the second direction, and (iii) facing the plurality of conductive layers;
   a plurality of first nitride films containing nitrogen (N), the plurality of first nitride films covering surfaces of the plurality of conductive layers facing the first structure;
   a first insulating layer disposed between two conductive layers adjacent to each other in the first direction among the plurality of conductive layers; and
   an additional nitride film containing nitrogen (N) and covering a surface of the first insulating layer facing the first structure.

2. The semiconductor storage device according to claim 1, wherein the plurality of conductive layers contain at least one of molybdenum (Mo) or ruthenium (Ru).

3. The semiconductor storage device according to claim 1, wherein the plurality of first nitride films contain at least one of molybdenum (Mo), ruthenium (Ru), tungsten (W), silicon (Si), titanium (Ti), or aluminum (Al).

4. The semiconductor storage device according to claim 3, wherein the plurality of first nitride films contain titanium nitride.

5. The semiconductor storage device according to claim 1, wherein the plurality of conductive layers and the plurality of first nitride films contain at least one of molybdenum (Mo) or ruthenium (Ru) in common.

6. The semiconductor storage device according to claim 1, further comprising:

a plurality of second nitride films containing nitrogen (N), and covering surfaces of one side and an other side of the plurality of conductive layers in the first direction, and covering a surface of the plurality of conductive layers facing the semiconductor layer.

7. The semiconductor storage device according to claim 6, wherein the plurality of second nitride films include at least one of molybdenum (Mo), ruthenium (Ru), tungsten (W), silicon (Si), titanium (Ti), or aluminum (Al).

8. The semiconductor storage device according to claim 6, wherein the plurality of conductive layers and the plurality of second nitride films contain at least one of molybdenum (Mo) or ruthenium (Ru) in common.

9. The semiconductor storage device according to claim 6, wherein the plurality of first nitride films and the plurality of second nitride films contain at least one of molybdenum (Mo), ruthenium (Ru), tungsten (W), silicon (Si), titanium (Ti), or aluminum (Al) in common.

10. The semiconductor storage device according to claim 6, wherein a film thickness of one of the plurality of first nitride films is larger than a film thickness of one of the plurality of second nitride films.

11. The semiconductor storage device according to claim 6, wherein a film thickness of one of the plurality of first nitride films is smaller than a film thickness of one of the plurality of second nitride films.

12. The semiconductor storage device according to claim 1, wherein the additional nitride film contains at least one of molybdenum (Mo), ruthenium (Ru), tungsten (W), silicon (Si), or aluminum (Al).

13. The semiconductor storage device according to claim 1, further comprising:
a second insulating layer disposed between the plurality of conductive layers and the semiconductor layer, and containing at least one of aluminum (Al), hafnium (Hf), zirconium (Zr), or La (lanthanum).

14. The semiconductor storage device according to claim 1, wherein the semiconductor layer contains polycrystalline silicon.

15. The semiconductor storage device according to claim 1, wherein the semiconductor layer functions as a channel region.

16. The semiconductor storage device according to claim 1, wherein one or more of the plurality of conductive layers function as gate electrodes.

17. The semiconductor storage device according to claim 1, wherein the charge storage layer contains silicon nitride.

* * * * *